United States Patent
Holber et al.

(10) Patent No.: US 7,659,489 B2
(45) Date of Patent: Feb. 9, 2010

(54) TOROIDAL LOW-FIELD REACTIVE GAS AND PLASMA SOURCE HAVING A DIELECTRIC VACUUM VESSEL

(75) Inventors: William M. Holber, Winchester, MA (US); Xing Chen, Lexington, MA (US); Andrew B. Cowe, Andover, MA (US); Matthew M. Besen, Andover, MA (US); Ronald W. Collins, Jr., Derry, NH (US); Susan C. Trulli, Lexington, MA (US); Shouquian Shao, Winchester, MA (US)

(73) Assignee: MKS Instruments, Inc., Andover, MA (US)

( * ) Notice: Subject to any disclaimer, the term of this patent is extended or adjusted under 35 U.S.C. 154(b) by 498 days.

(21) Appl. No.: 11/684,916

(22) Filed: Mar. 12, 2007

(65) Prior Publication Data

US 2007/0145023 A1 Jun. 28, 2007

Related U.S. Application Data

(63) Continuation of application No. 11/058,620, filed on Feb. 15, 2005, now Pat. No. 7,501,600, which is a continuation of application No. 10/417,408, filed on Apr. 16, 2003, now Pat. No. 6,872,909.

(51) Int. Cl.
*B23K 10/00* (2006.01)
(52) U.S. Cl. .............................. 219/121.52; 219/121.43; 219/121.48; 118/723 I; 118/723 MW; 315/111.51
(58) Field of Classification Search ............ 219/121.52, 219/121.43, 121.41, 121.44, 121.48, 121.54; 118/723 I, 723 MW; 315/111.51
See application file for complete search history.

(56) References Cited

U.S. PATENT DOCUMENTS

| 1,534,251 A | 4/1925 | Smith |
| 3,291,715 A | 12/1966 | Anderson |
| 4,615,851 A | 10/1986 | Theodore et al. .............. 264/63 |
| 5,273,609 A | 12/1993 | Moslehi ...................... 156/345 |
| 5,274,306 A | 12/1993 | Kaufman et al. ........ 315/111.41 |

(Continued)

OTHER PUBLICATIONS

Communication Relating to the Results of the Partial International Search for International Patent Application No. PCT/US04/011183, date of mailing Oct. 13, 2004, 11 pages.

*Primary Examiner*—Mark H Paschall
(74) *Attorney, Agent, or Firm*—Proskauer Rose LLP

(57) ABSTRACT

Plasma ignition and cooling apparatus and methods for plasma systems are described. An apparatus can include a vessel and at least one ignition electrode adjacent to the vessel. A total length of a dimension of the at least one ignition electrode is greater than 10% of a length of the vessel's channel. The apparatus can include a dielectric toroidal vessel, a heat sink having multiple segments urged toward the vessel by a spring-loaded mechanism, and a thermal interface between the vessel and the heat sink. A method can include providing a gas having a flow rate and a pressure and directing a portion of the flow rate of the gas into a vessel channel. The gas is ignited in the channel while the remaining portion of the flow rate is directed away from the channel.

34 Claims, 16 Drawing Sheets

U.S. PATENT DOCUMENTS

| | | | |
|---|---|---|---|
| 5,541,385 A | 7/1996 | Konkola | 219/121.6 |
| 5,834,905 A | 11/1998 | Godyak et al. | 315/248 |
| 5,932,116 A | 8/1999 | Matsumoto et al. | 219/121.57 |
| 5,972,450 A | 10/1999 | Hsich et al. | 428/35.9 |
| 5,981,899 A | 11/1999 | Perrin et al. | 219/121.52 |
| 6,037,562 A | 3/2000 | Awakowicz et al. | 219/121.59 |
| 6,063,233 A | 5/2000 | Collins et al. | 156/345 |
| 6,150,628 A | 11/2000 | Smith et al. | 219/121.54 |
| 6,156,667 A | 12/2000 | Jewett | 438/715 |
| 6,167,835 B1 | 1/2001 | Ootera et al. | 118/723 |
| 6,258,735 B1 | 7/2001 | Xia et al. | 438/788 |
| 6,329,297 B1 | 12/2001 | Balish et al. | 438/714 |
| 6,387,288 B1 | 5/2002 | Bjorkman et al. | 216/67 |
| 6,418,874 B1 | 7/2002 | Cox et al. | 118/723 |
| 6,441,552 B1 | 8/2002 | Brandenburg et al. | 315/111.21 |
| 6,461,409 B1 | 10/2002 | Neff et al. | 95/78 |
| 6,465,964 B1 | 10/2002 | Taguchi et al. | 315/111.21 |
| 6,466,426 B1 | 10/2002 | Mok et al. | 361/234 |
| 6,759,624 B2 | 7/2004 | Kumar et al. | 219/121.36 |
| 6,815,633 B1 | 11/2004 | Chen et al. | 219/121.54 |
| 7,193,369 B2 | 3/2007 | Min et al. | 315/111.11 |
| 7,323,401 B2 | 1/2008 | Ramaswamy et al. | 438/551 |
| 2002/0096259 A1 | 7/2002 | Collins et al. | 156/345.48 |
| 2003/0089686 A1 | 5/2003 | Choi | 219/121.36 |
| 2003/0129106 A1 | 7/2003 | Sorensen et al. | 422/186.05 |

# TOROIDAL LOW-FIELD REACTIVE GAS AND PLASMA SOURCE HAVING A DIELECTRIC VACUUM VESSEL

RELATED APPLICATIONS

This application is a continuation of patent application Ser. No. 11/058,620, filed on Feb. 15, 2005, which is a continuation of U.S. Pat. No. 6,872,909, filed on Apr. 16, 2003, the entire disclosures of which are incorporated herein by reference.

FIELD OF THE INVENTION

The present invention relates generally to plasma generation and processing equipment. In particular, the present invention relates to methods and apparatus for plasma ignition and cooling of plasma vessels.

BACKGROUND OF THE INVENTION

Plasma discharges can be used to dissociate gases to produce activated gases containing ions, free radicals, atoms and molecules. Activated gases are used for numerous industrial and scientific applications including processing materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage, or because there is a requirement for selective etching of one material relative to another. Other applications, such as anisotropic etching or planarized dielectric deposition, require the use of ions with high kinetic energy.

Some applications require direct exposure of the material being processed to a high density plasma. Such applications include ion-activated chemical reactions and etching of and depositing of material into high aspect-ratio structures. Other applications require shielding the material being processed from the plasma because the material is sensitive to damage caused by ions or because the process has high selectivity requirements.

Plasmas can be generated in various ways including direct current (DC) discharge, radio frequency (RF) discharge, and microwave discharge. DC discharges are achieved by applying a potential between two electrodes in a gas. RF discharges are achieved either by capacitively or inductively coupling energy from a power supply into a plasma.

Parallel plates can be used to capacitively couple energy into a plasma. Induction coils can be used to induce current in the plasma. Microwave discharges can be produced by coupling a microwave energy source to a discharge chamber containing a gas.

Plasma discharges may be generated in a manner such that both the charged species constituting the plasma and the neutral species, which may be activated by the plasma, are in intimate contact with the material being processed. Alternatively, the plasma discharge may be generated remotely from the material being processed, so that relatively few of the charged species come into contact with the material being processed, while the neutral species may still contact it.

Such a plasma discharge is commonly termed a remote or downstream plasma discharge. Depending on its construction, positioning relative to the material being processed, and operating conditions (gas species, pressure, flow rate, and power into the plasma), a plasma source can have characteristics of either or both of these two general types.

Existing remote plasma sources generally utilize RF or microwave power to generate the plasma. Although present sources support many applications successfully, several technical limitations remain in the practical use of those sources.

Microwave-based remote plasma sources are generally more expensive than RF sources because microwave power is generally more expensive to produce, deliver, and match to a load. Microwave sources and a power delivery system are also generally more bulky than RF sources and require periodic replacement of a tube which generates the microwave power.

RF remote plasma sources that have some degree of capacitive as well as inductive coupling may be less expensive and smaller than the corresponding microwave sources. The capacitive coupling, however, which assists in the plasma ignition process, also may lead to degradation of the exposed walls of the plasma vessel due to bombardment of those walls by energetic ions produced in the plasma. RF remote plasma sources that utilize inductive RF coupling, but which minimize associated capacitive coupling, may show less ion-induced degradation of the plasma vessel surfaces. The reduction or elimination of the capacitive coupling, however, can make plasma ignition more difficult to obtain, especially over a wide range of process conditions.

A second difficulty with existing remote plasma sources is removal of the heat generated in the plasma and deposited onto the walls of the plasma vessel. This is especially the case when the plasma vessel has a complex shape and when it is composed of a dielectric material for which direct cooling with large quantities of fluid in contact with the dielectric vessel is either undesirable or impractical. This has the effect of limiting the power that can be reliably coupled into the plasma.

Existing toroidal plasma systems, for example, can be highly inductive in the manner in which the RF energy is coupled into the plasma. The plasma may be ignited, for example, via a capacitively coupled RF ignition discharge or via ultraviolet radiation. The plasma system can require separate plasma ignition steps with specific gas species, pressure and flow rate requirements. The specific requirements can be different from operating condition requirements. These constraints can both add additional complexity to the elements of the vacuum and gas handling systems used in conjunction with the plasma system and can also increase the overall time need for processing.

SUMMARY OF THE INVENTION

The invention features apparatus and methods that, in part, can provide reliable ignition of a plasma in a vessel, and provide effective and reliable cooling of the vessel. To this end, the invention features larger area and/or longer ignition electrodes than in prior plasma systems, bypass of input gas to the plasma vessel during ignition, ignition near a gas input port of a plasma vessel, and gapped or ungapped heat removal structures disposed between a heat sink and a vessel. Features of the invention enable a range of applications unavailable in prior plasma systems.

Some implementations of features of the invention include a dielectric vessel. A dielectric vessel can have surfaces exposed to the plasma which are of a higher purity and which offer a lower recombination rate than obtainable from a metal or coated-metal vessel for reactive neutral species such as O, N, H, F, Cl, and Br.

The invention can provide ignition of a plasma over a wider process range than available in, for example, previous toroidal-plasma systems. A capacitive discharge filling a larger portion of the volume of the channel in a vessel than in prior systems can provide ignition over a wider range of gas parameters (e.g., types of gases, flow rate, and gas pressure.) Improved ignition in turn can support more reproducible processes and shorter process results than prior systems having, for example, more difficult and/or lengthy ignition steps.

The invention provides, in part, a distributed capacitive discharge that fills a substantial portion of the volume of a plasma vessel to assist ignition. Easier ignition can in turn support quicker and more stable initiation of processing. The ability to ignite a plasma at or near operating conditions can be advantageous, for example, for processes having short cycles, such as atomic layer deposition (ALD).

Some embodiments of the invention feature large and/or spatially distributed capacitively-coupled electrodes adjacent to the vessel to provide a distributed capacitive discharge. The electrodes can ignite a plasma in the vessel by applying an ionizing electric field within the vessel through a large portion of the vessel's channel. Ignition can thus be achieved in gas species and at flow rates not available in some prior plasma generation systems. The ignition electrodes can be part of cooling components and/or thermal interface components between a cooling shell and a dielectric vessel.

Some implementations of the invention include one or more ignition electrodes positioned at and/or near one or more input ports of a vessel. These electrodes can be discharged to seed gas inside the vessel with ionized species to ignite a plasma, alone or in cooperation with other electrodes and/or other means of ignition.

The invention can provide cooling of a dielectric vessel at power levels up to 100 kW and greater without a need for air blowers or direct fluid cooling of the dielectric vessel. A heat sink in the form of a cooled shell can be positioned in close proximity to the vessel, with a gap containing a thermally conductive and/or deformable material, including, for example, a metal, a polymer and/or a composite or laminate material.

The gap-filling material provides a thermal-conduction path between the cooled shell and dielectric vessel. The material may have varying degrees of elasticity, and the cooled shell can hold the gap-filling material in intimate contact both with the outside of the dielectric vessel and the surface of the cooled shell. This may help to assure good thermal contact between the dielectric vessel, the gap-filling material, and the cooled shell.

In a preferred implementation, a toroidal low-field reactive gas source is constructed with a vacuum vessel formed of a dielectric material. Cooling of the vessel provides reliable operation over a broad range of operating powers. Applications of the source include semiconductor processing and process chamber cleaning. Other applications include, for example, supplying of activated gaseous species in chemical processes, and converting or removing of hazardous or undesirable gaseous species from effluent gas streams.

In some preferred embodiments, the invention features a toroidal-shaped dielectric vessel surrounded by a cooled shell. The cooled shell can be spaced from the vessel by a thermal interface, such as the gap-filling material described above, that provides mechanical accommodation of thermally induced dimensional changes.

The thermal interface can include one or more materials having elastic and/or plastic mechanical properties to absorb dimensional changes arising from thermal-mechanical mismatch between the cooled shell and the dielectric vessel. The thermal interface can define a very thin spacing between the vessel and the shell.

In some of these embodiments, the cooled shell is actively compressed against the outside surface of the dielectric vessel via a spring-loaded mechanism to keep the thermal interface in intimate thermal contact with both the outside of the dielectric vessel and the cooled shell. A cooled shell having multiple segments joined to each other with spring-loaded mechanisms can support use of a vessel having a complex shape, such as a toroidal shape, and can provide a self-supporting cooling structure that can accommodate thermal-mismatch stresses between the vessel and the shell.

In some embodiments of the invention, the external surface of a dielectric vacuum vessel is coated with a layer that blocks ultraviolet radiation generated by the plasma from passing through the dielectric vessel into the gap, where it could cause degradation of a thermal interface material and/or production of ozone. The coating can be light opaque and/or have reflective and/or absorptive properties. The external coating layer may act as a heat spreading layer and thereby assist cooling of the dielectric vacuum vessel.

In some embodiments, the internal surface of a vacuum vessel is coated with a layer that resists attack by energetic ions or reactive neutral species. A coating can provide reduced plasma constituent recombination rates. Examples of internal coatings include silicon nitride, silicon dioxide, aluminum oxide, aluminum nitride, diamond, and polymer materials.

Plasma sources and systems, according to principles of the invention, are useful, for example, for processing numerous materials such as solid surfaces, powders, and gases. The systems are also useful for cleaning process chambers in semiconductor processing equipment such as thin film deposition and etching systems. A plasma source can also be used to provide ions for ion implantation and ion milling systems.

In addition, a plasma source can support an etching system used to fabricate semiconductor devices (to etch, for example, silicon, silicon dioxide, silicon nitride, aluminum, molybdenum, tungsten and organic materials such as photoresists, polyimides and other polymeric materials.) A plasma source can also support plasma-enhanced deposition of thin-film materials formed from, for example, diamond, silicon dioxide, silicon nitride, and aluminum nitride. Both high and low dielectric constant materials as well as conducting and semi-conducting materials may be deposited by plasma-enhanced deposition.

The systems are also useful for generating reactive gases such as atomic fluorine, atomic chlorine, atomic bromine, atomic hydrogen, atomic nitrogen, and atomic oxygen. Such reactive gases are useful for reducing, converting, stabilizing or passivating various semiconducting materials such as silicon, germanium and GaAs, and oxides such as silicon dioxide, tantalum oxide, hafnium oxide, tin oxide, zinc oxide, ruthenium oxide and indium-tin oxide. Applications include fluxless soldering, removal of silicon dioxide from silicon surfaces, passivation of silicon surfaces prior to wafer processing and deposition or etching of various materials.

Other applications include modification of surface properties of polymers, metals, ceramics and papers. A system can also support abatement of hazardous or environmentally undesirable gases including fluorine-containing compounds such as $CF_4$, $NF_3$, $C_2F_6$, $CHF_3$, $SF_6$, and organic compounds such as dioxins and furans and other volatile organic compounds. A system can generate high fluxes of atomic oxygen, atomic chlorine, or atomic fluorine for sterilization. A system can support an atmospheric pressure discharge.

Accordingly, in a first aspect, the invention features a plasma ignition apparatus. The apparatus includes a vessel and at least one ignition electrode adjacent to the vessel. The electrode has a dimension aligned with an adjacent portion of a channel enclosed by the vessel. A total length of the dimension of the at least one ignition electrode is greater than 10% of a length of the channel. The at least one ignition electrode can apply an electric field to a gas in the channel to initiate plasma discharge of the gas.

The apparatus can include a reference electrode to work in cooperation with the ignition electrode. The reference electrode and/or the ignition electrode can also act as a heat sink to remove heat from the vessel.

In a second aspect, the invention features a plasma ignition apparatus that includes at least one ignition electrode having an area greater than 1% of a total external surface area of the vessel. The apparatus can include a reference electrode, where the total surface area of the reference electrode and the at least one ignition electrode is in a range of 2% to 100% of a total external surface area of the vessel. Some embodiments related to these features include a dielectric plasma vessel; other embodiments include a metallic plasma vessel and the at least one ignition electrode has an area greater than 10% of the total external surface area of the metallic vessel.

In a third aspect, the invention features a plasma ignition apparatus that includes at least three ignition electrodes. In a fourth aspect, the invention features a plasma ignition apparatus that includes a vessel having a gas input port and a gas output port and an ignition electrode adjacent to the gas input port for application of an electric field to a flowing gas proximate to the input port of the vessel. The ignition electrode can be positioned upstream from the gas input port.

In a fifth aspect, the invention features a plasma apparatus. The apparatus includes a toroidal vessel formed from a dielectric material, a heat sink adjacent to the vessel, and a thermal interface. The thermal interface is disposed between, and in mechanical communication with, the vessel and the heat sink. The thermal interface defines a space between the heat sink and the vessel that accommodates a movement of the thermal interface, the heat sink, and/or the vessel in response to thermally induced dimensional changes. The heat sink can include more than one portion, and the portions can be joined by a spring-loaded mechanism to accommodate the shape of the vessel and dimensional changes.

A coating can be applied to the outside of the vessel to block ultraviolet radiation generated in the plasma from entering the space between the heat sink and the vessel. The coating can also aid in cooling the dielectric vessel.

In a sixth aspect, the invention features a method for igniting a plasma. The method includes providing a vessel having a gas input port and an output port, flowing a gas into the channel via the input port, and igniting the gas in the channel by applying an ionizing electric field to the gas proximate to the gas input port while the gas is flowing into the channel.

In a seventh aspect, the invention features a method for igniting a plasma. The method includes providing a gas having a flow rate and a pressure and directing a portion of the flow rate of the gas into a vessel channel. The gas is ignited in the channel while at least a portion of the flow rate is directed away from the channel. Some or all of the flow rate can be directed into the channel after igniting the gas.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
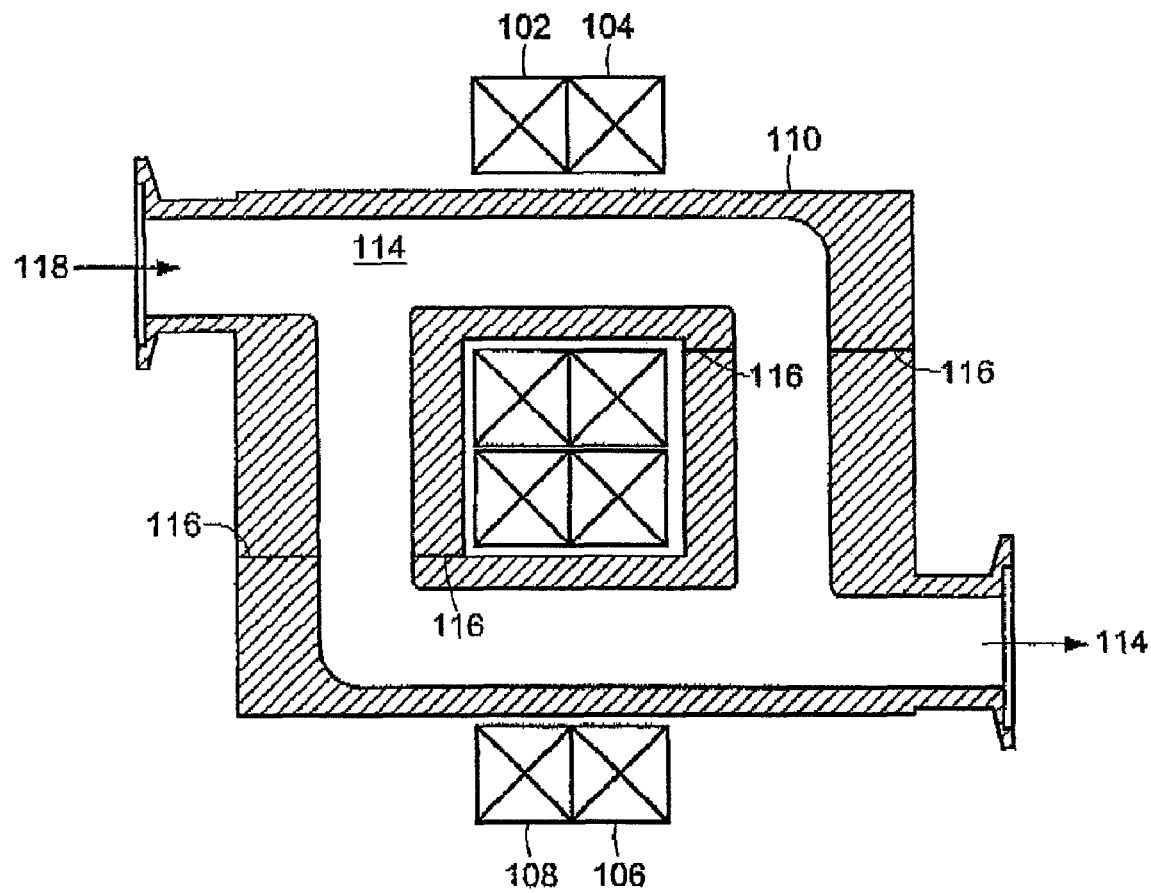
FIG. 1 is a schematic view of a cross section of an embodiment of a toroidal plasma system.

Definitions—A "plasma system" is an apparatus that includes plasma generation components, and can include materials processing components. A plasma system can include one or more vessels, power supply components, metrology components, control components, and other components. Processing can occur in one or more vessels and/or in one or more processing chambers in communication with the one or more vessels. A plasma system can be a source of plasma or reactive gas species generated in a plasma or can be a complete processing tool.

A "vessel" is a container or portion of a container that contains a gas and/or a plasma, and within which a plasma can be ignited and or/maintained. A toroidal vessel includes at least one dielectric portion, or is formed entirely of dielectric material. A vessel can also be referred to as a plasma body. A vessel is combined with other components, such as power generation and cooling components to form a plasma processing system. A vessel can define channels having a variety of shapes. For example, a channel can have a linear shape, or can have a loop shape (e.g., to support a toroidal plasma).

A "channel" is the volume defined and enclosed by a vessel. A channel can contain a gas and/or a plasma, and can be in communication with one or more input ports and one or more output ports of the vessel, for receiving and delivering gas and plasma species. A plasma system can include means to apply a DC or oscillating electric field within the channel. The electric field can maintain a plasma in the channel, and can, alone or in cooperation with other means, ignite a plasma in the channel.

The "length of a channel" is the total path length along which a plasma can reside. For a toroidal channel, the length can be defined as the distance of one circuit around the channel. Thus, a circular-shaped channel has a length equal to the circumference of a circle associated with the middle of the channel.

A "plasma" is a state of matter that includes a collection of charged particles that are related to a gas. As used herein, a plasma can include neutral atoms and/or molecules associated with the ionized species. The matter in a vessel, after ignition, is herein broadly referred to as a plasma without intending to limit such matter to that consisting solely of species in a plasma state.

A "toroidal plasma" is a plasma in the form of a closed path and with plasma current circulating in the closed path. A toroidal plasma can reside in a "toroidal channel" enclosed by a "toroidal vessel".

"Ignition" is the process of causing an initial breakdown in a gas, to form a plasma.

An "ignition electrode" is an electrode that is capacitively coupled to a vessel, and to which a voltage can be applied for ignition of a gas in the vessel. An ignition voltage can be applied, for example, between an ignition electrode and a reference electrode or between an ignition electrode and a conductive portion of a vessel. One or more ignition electrodes can be adjacent to an inner or outer surface of a vessel (the illustrative embodiments described herein include ignition electrodes adjacent to an outer surface.)

The term "reference electrode" depending on context herein should be construed broadly to refer to one or more electrodes and/or one or more conductive portions of a vessel that act in cooperation with one or more ignition electrodes.

"Inert gases" are gases that in many circumstances are non-reactive or have low reaction rates, including argon and the other noble gases.

"Noble gases" are a group of rare gases that include helium, neon, argon, krypton, xenon, and sometimes radon, and that exhibit chemical stability and low reaction rates.

A "reactive gas" is a gas containing some species that are prone to engage in one or more chemical reactions. Reactive gases include gases that are not inert gases.

An "activated gas" includes any of ions, free radicals, neutral reactive atoms and molecules.

A "heat sink" is a structure including one or more portions and/or components for absorption, dissipation and/or removal of heat. A heat sink can also be an electrode, for example, an ignition electrode and a reference electrode.

The above-mentioned features of the invention and others will be described in more detail after first describing some structural and operational aspects of toroidal plasma systems, with reference to FIGS. 1 and 2.

FIG. 1 is a cross-sectional schematic view of a portion of an embodiment of a toroidal plasma system 100. The portion includes a vessel 110 that defines a channel 114, magnetic cores 102, 104, 106, 108, a gas inlet 118, an outlet 119, and a mating surface 116.

The vessel 110 can be formed entirely from one or more dielectric materials, or can be formed from both conductive and dielectric materials. Appropriate conductive materials include metals such as aluminum, copper, nickel and steel. The vessel 100 may also be formed from a coated metal such as anodized aluminum or nickel plated aluminum. In some embodiments of the invention, described in more detail below, the vessel 110 is formed from a dielectric material, and is surrounded by heat sink materials to assist cooling of the dielectric material.

The vessel 110 includes at least one dielectric region, for example, at the mating surface 116, which electrically isolates a portion of the vessel 110 so that electrical continuity around the vessel 110 is broken. If the vessel is formed entirely of dielectric material, the vessel 110 can be formed of a single piece of material, having no joined surfaces, and thus not including the mating surface 116.

Joined surfaces of the vessel 110 can provide a high vacuum seal. The seal can include an elastomer seal or can be a permanent seal such as a brazed joint.

As shown, magnetic cores 102, 104, 106, 108 surround portions of the vessel 110, i.e., portions of the channel 114. The magnetic cores 102, 104, 106, 108, together with primaries (not shown) of a transformer, induce an electric field and a current aligned with the channel 114, as described, for example, in U.S. Pat. No. 6,150,628 to Smith et al. A plasma in the channel 114 completes a secondary circuit of the transformer.

The transformer can include additional magnetic cores and conductor primary coils that form additional secondary circuits. The primary coils can be powered, for example, by an AC power supply having a frequency, for example, in a range of less than 10 kHz to greater than 20 MHz. The choice of frequency will depend on the desired power and voltage to be applied to the plasma.

The selection of optimal operating frequency can depend on the application, the AC power supply, and the magnetic core materials. Gases such as oxygen and nitrogen, for example, having a pressure in a range of 1 torr to 10 torr can be utilized with particular advantage at a frequency from 50 KHz to 14 MHz.

The magnetic cores 102, 104, 106, 108 can have primary windings that are adjustable. This can permit, for example, the voltage and current applied to the plasma to be optimized for ignition and for a particular process operating condition (for example, for particular pressure, flow rate and gas species conditions.)

Electrical components can be in a circuit path between an output of the AC power supply and an input of the primary of the magnetic cores 102, 104, 106, 108. These components can include resistors, capacitors, and/or inductors. For example, a series inductor can be used to smooth a voltage waveform applied to the plasma, and thus improve plasma stability.

The components can be fixed or variable, with variability controlled, for example, via electrical or mechanical means. The components can form an impedance altering circuit or an impedance matching network.

A resonant circuit at the output of or built into the AC power supply can be used to raise an ignition voltage and the loop voltage (i.e., the voltage drop along the channel) for ignition purposes. A resonant circuit can also reduce plasma instability arising from AC line fluctuations.

A DC power source connected to an input of the AC power supply can be obtained via rectification and filtering of an AC line voltage. The DC power source voltage can be regulated via additional circuitry to stabilize the voltage applied to the plasma and to provide regulation relative to variability in AC line voltage. The DC source voltage and current can also be used to control the power delivered to the plasma.

It can be desirable to monitor various parameters, such as power, current and voltage. Power delivered to the plasma can be estimated, for example, by measuring the power output by the DC power source. Power measurement can be refined by measuring or estimating electrical losses in the electrical elements disposed between the output of the DC power source and the plasma. Power can also be measured, for example, at the output of the AC power supply.

Power delivered to the plasma can be controlled via several means, for example, by varying: the magnitude of the DC power source voltage; the peak current applied to the plasma; the duty cycle of the AC power applied to the plasma; the magnitude of the AC voltage applied to the plasma; and the frequency of the AC power applied to the plasma. The efficiency of the power transfer between the output of the AC power supply and the plasma can be varied to vary the power applied to the plasma.

To reduce cost and complexity of a plasma source and its AC power supply and control system, these components can be integrated into a single enclosure. Alternatively, to increase flexibility, the plasma source can be separated from any of the following: the AC power supply, the DC power source, and the control system. A dielectric plasma vessel and related cooling and mounting components can be separated from other components to assist component replacement in the field.

The shape of the vessel 110 can be modified. For example, the vessel 110 can be a square donut shape (as shown), a rectangular donut shape, a round donut shape, etc.

In operation, a feed gas flows into the gas inlet 118. A gas can be fed into the channel 114 until a pressure between, for example, 0.001 Torr and 1000 Torr is reached.

The gas can include an inert gas, a reactive gas or a mixture of at least one inert gas and at least one reactive gas. The gas composition can be varied, for example, by providing one composition for ignition and a second composition for process operating conditions.

Portions of the plasma can be delivered from the channel 114 via the outlet 119. In some embodiments, a plasma system is configured so that little or none of the ionized species leaves a plasma vessel. In other embodiments, some ionized species are delivered from a vessel, for example, to assist processing in a chamber in communication with the vessel. In still other embodiments, the vessel is integrated with a process chamber, so that plasma is generated within the chamber.

Once the gas is ionized, a plasma forms and completes a secondary circuit of the transformer. The electric field in the plasma can be in a range of less than 1 to greater than 100 volt/cm. If only noble gases are present in the vessel 110, the electric fields in the plasma can be as low as 1 volt/cm or less. If, however, electronegative gases are present in the chamber, the electric fields in the plasma can be considerably greater than 1 volt/cm.

Operating the vessel 110 with low electric fields in the channel 114 can be beneficial because a low potential difference between the plasma and the chamber can reduce erosion of the chamber by energetic ions and related contamination of a material being processed.

The vessel 110 can include means for generating free charges that provides an initial ionization event that ignites a plasma in the vessel 110. The initial ionization event can be a short, high voltage pulse that is applied to the plasma chamber. The pulse can have a voltage of approximately 500-20,000 volts, and can be approximately 0.1 to 10 microseconds long. The initial ionization event may also be generated by use of a high voltage pulse of longer duration, approximately 10 microseconds to 3 seconds, which may be an RF pulse. An inert gas, such as argon, can be inserted into the channel to reduce the voltage required to ignite a plasma. Ultraviolet radiation can also be used to generate the free charges in the vessel 110 that provide the initial ionization event that ignites the plasma in the vessel 110.

In one implementation, the short, high voltage electric pulse is applied to the primary of the magnetic cores to provide the initial ionization event. In another implementation, the short, high voltage electric pulse is applied to an electrode or electrodes positioned in or on the vessel 110. Ignition is described in more detail below, with respect to other illustrative embodiments of the invention.

Figure 2A:
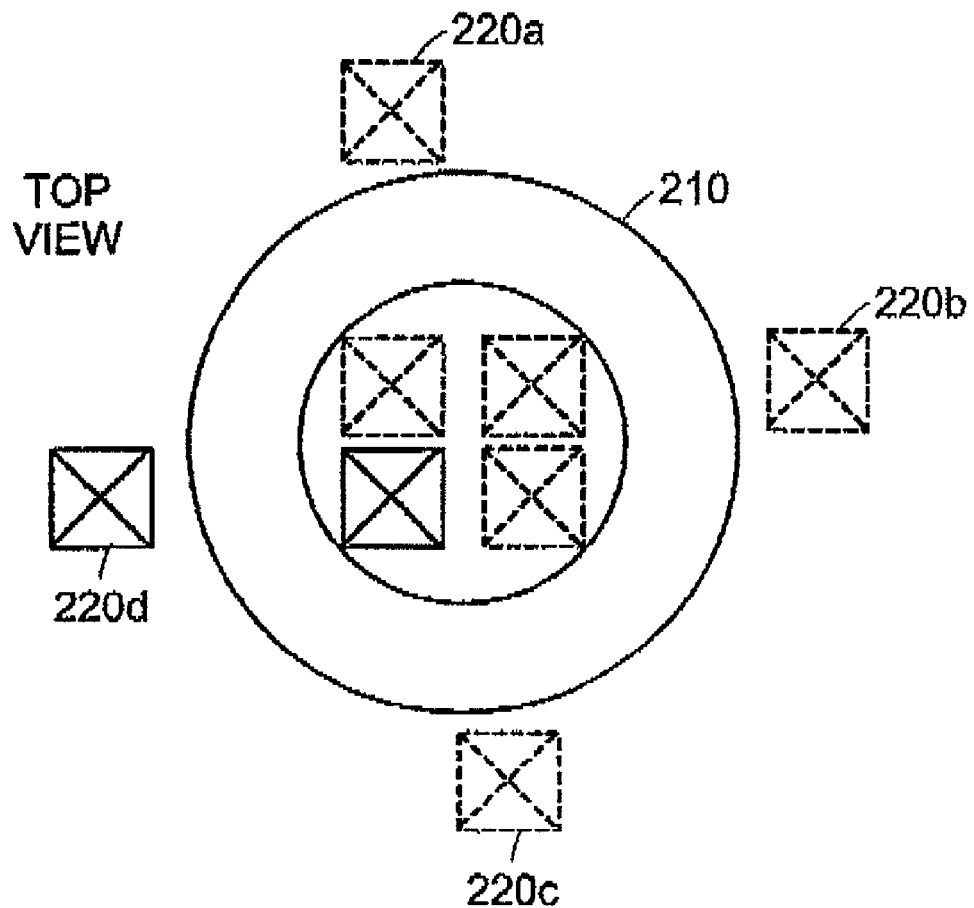
FIG. 2A is a schematic top-view cross section of an embodiment of a portion of a plasma system.
Figure 2B:
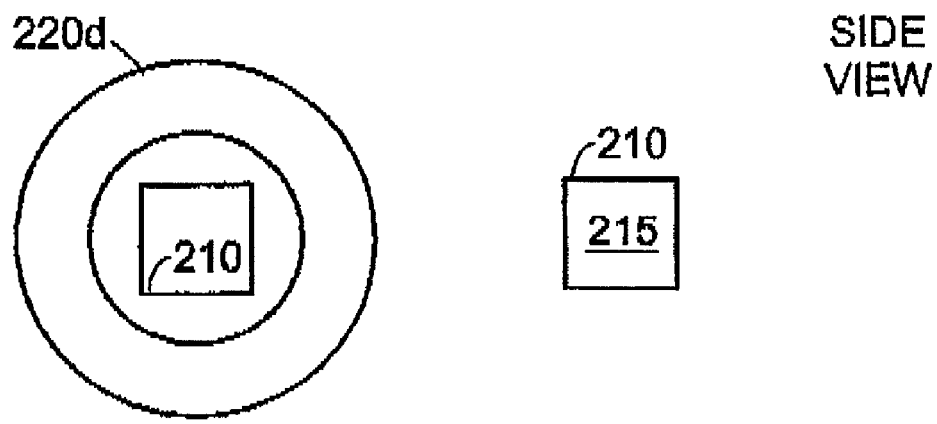
FIG. 2B is a schematic side-view cross section of the embodiment of the portion of the plasma system of FIG. 2A.

Now referring to FIGS. 2A and 2B, most embodiments described herein are directed at symmetrical, loop-shaped dielectric vessels, though principles of the invention can be applied to plasma systems having a variety of vessel configurations and materials components. Accordingly, the illustrative embodiments should not be construed as limiting implementations of the invention to systems that are symmetric or that include loop-shaped vessels, or to systems having vessels that are entirely formed from a dielectric material.

FIGS. 2A and 2B, respectively, are schematic top-view and side-view cross sections of an embodiment of a portion of a plasma system 200. The system 200 includes a vessel 210 and a magnetic core 220d (three optional magnetic cores 220a, 220b, 220c are shown in dashed lines.) FIG. 2B. illustrates a section through the magnetic core 220d and the vessel 210. Alternative implementations of the system 200 include two, three, or more than four magnetic cores.

The vessel 210 encloses a channel 215, which has a square cross-section shape and within which a plasma can be maintained. The vessel 210 is formed from a single piece of dielectric material. The dielectric material can be, for example, quartz, sapphire, alumina, aluminum nitride, or other ceramic materials. The material used to form the vessel 210 can be chosen based on planned applications for the system 200. For example, the material can be chosen based on a planned power of operation, plasma species and/or required purity level.

The vessel 210 supports a toroidal plasma, and has a circular donut shape with a square cross section. Other vessels that support a toroidal plasma can have a variety of shapes. Such shapes can include, for example, any of the following overall shapes: an elliptical donut shape; a square donut shape; a rectangular donut shape; and a polygonal donut shape, and can have, for example, a circular cross section or an elliptical cross section.

The vessel 210 can include one or more gas inlet ports and one or more outlet ports. Multiple ports can be included to provide additional control over the plasma in the vessel 210. Control of gas flow, in particular during ignition, is discussed below in more detail.

Figure 3:
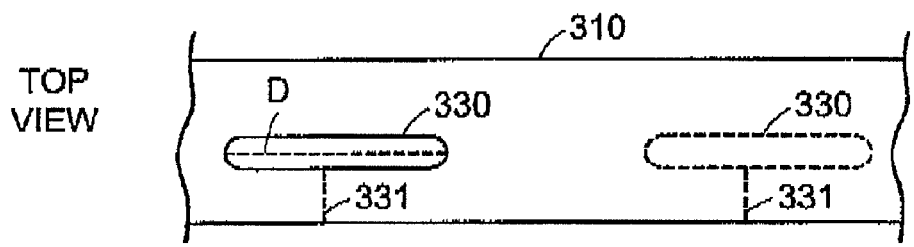
FIG. 3 is a schematic top-view of an embodiment of a portion of a plasma system.

Now referring to FIGS. 3 to 11, aspects of the invention that involve improved ignition apparatus and methods are described. FIG. 3 is a schematic top view of a portion of an embodiment of a plasma system 300. The system 300 includes a vessel 310 (portion shown) and an ignition electrode 330 adjacent to the vessel 310.

The vessel 310, in different implementations of the system 300, can be shaped to define, for example, a linear channel or a toroidal channel. The system 300 can include additional ignition electrodes 330 (as illustrated by the electrode 330 drawn with a dashed line) and can include interconnect 331 to supply a voltage to the electrode 330. The following description is applicable to systems 300 with one ignition electrode 330 or more than one electrode 330.

The electrode 330 has a dimension D (indicated by a dashed line) that is aligned with the channel defined within the vessel 310. The dimension D of the electrode 330 has a length. In the example of FIG. 3, the electrode 330 has a rectangular shape with a long dimension aligned with the channel. Thus, in this example, the length of the dimension D of the electrode 330 is the same as the long dimension of the rectangle. When more than one electrode 330 is included, the total length of the dimension aligned with the channel is herein understood to be the combined length of the dimensions of each of the electrodes 330.

More complex distributions of ignition electrodes can be envisioned, in comparison to that shown in FIG. 3. For example, ignition electrodes can be positioned side-to-side or staggered, in addition to the linear distribution of FIG. 3. Thus, the total length of the dimension of the ignition electrodes corresponds to a length along the channel that is covered by one or more ignition electrodes.

A voltage is applied to the electrode 330 to ignite or support ignition of a gas in the channel. The system 300 can include a reference electrode that is used in cooperation with the ignition electrode 330 to apply an electric field to the gas in the channel. The reference electrode can be a ground electrode. Alternatively, the ignition electrode 330 can be a ground electrode while a voltage is applied to the reference electrode. The reference electrode can include one or more portions. Implementations that include a conductive portion in a vessel can utilize the conductive portion of the vessel as a reference electrode or ignition electrode.

The ignition electrode 330 can have a shape, size, and/or location that provides improved ignition relative to that available in prior plasma systems. The electrode 330 supports a capacitive ignition discharge, which is distributed along the channel defined by the vessel 310. A long electrode 330 and/or multiple electrodes 330 can simultaneously ignite a continuous or close to a continuous plasma along the channel.

The one or more electrodes 330 have a total length along the channel that is, for example, greater than approximately 5% of the channel length. Ignition performance can be improved by increasing the total length. For example, a total length greater than 10% can provide improved ignition.

Some preferred implementations of the invention include a total length of the dimension of ignition electrodes in a range of 10% to 80%, or greater. The total length can be 100% of the vessel length (in the case of a toroidal vessel, the total length can be 100% of the length of the vessel, i.e., the circumference of the mid-channel of the vessel, as long as the ignition electrodes have at least one electrical discontinuity.) It will be apparent to one having ordinary skill that the ratio of the electrode length to the channel length is dependent on the chosen definition of channel length. For convenience, the channel length is herein chosen to correspond to the maximum electrode length. It will be apparent the channel length need not be chosen to correspond to the mid-channel and that electrodes can be placed elsewhere than over the mid-channel. Alternatively, ignition electrodes, according to principles of the invention, can be defined in terms of area (the area of an ignition electrode is herein understood to be the area of a surface of the electrode that faces the vessel).

Accordingly, the one or more ignition electrodes 330 can have a large total area relative to the size of the vessel 310. The relationship of the area of the ignition electrode 330 to the size of the vessel can be expressed, for example, as a total electrode 330 area to a total external or internal surface area of the vessel 310.

In most implementations, the total ignition electrode 330 area can be at most 100% of the total external surface area of the vessel 310. It will be apparent, however, that principles of the invention can be implemented with ignition electrode portions that reside other than adjacent to an external surface of a vessel, thus enabling the area ratio to be greater than 100%. Further, for example, an ignition electrode having an irregular surface can provide an area ratio of greater than 100%.

Complete coverage of the vessel 310 with ignition electrodes is generally not desirable, as there will be an optimum ratio of ignition electrode area to reference electrode area. Hence, the total area of the ignition electrode 330 can be less than 50% of the external surface area of the vessel 310 while still covering most of the vessel 310 with electrodes. In some implementations, the total area of ignition and reference electrodes is in a range of 1% to 99% of the total internal surface area of the vessel 310.

In some preferred implementations of the system 300, the combined total area of ignition electrodes 330 and reference electrodes is in range of 3% to 75% of the total internal surface area of the adjacent vessel. In general, an increase in ignition electrode 330 area and/or reference electrode area can increase the range of operation of an ignition stage of the system 300.

Benefits, according to principles of the invention, can also be provided by including as many as two, three, four, or more ignition electrodes 330. The electrodes 330 can be distributed along the length of the vessel, and can be evenly space along the vessel 310.

In some implementations, an RF voltage or a pulsed voltage is applied to the ignition electrode 330 to ignite a gas in the channel. Greater ignition electrode 330 area can increase the degree of capacitive coupling to provide a greater density of an initial plasma breakdown and to provide an initial plasma breakdown through a larger portion of the plasma vessel, thereby easing the formation of the toroidal plasma.

A peak voltage applied to the electrode 330 can be in a range of 500 V to 20 kV, or at lower or higher voltages. Thus, operation of the vessel 310 can commence with a capacitively coupled discharge followed by an inductively coupled discharge applied by one or more magnetic cores.

The pressure in the channel during an ignition step can range, for example, from 0.001 to 1000 torr. Ultraviolet (UV) light can be used to assist ignition by creating photoelectrons adjacent to the inside surface of the vessel 310.

The vessel 310 can have a variety of configurations. Examples of some alternative configurations are described with reference to the embodiments of the invention illustrated in FIGS. 4 through 6.

Figure 4A:
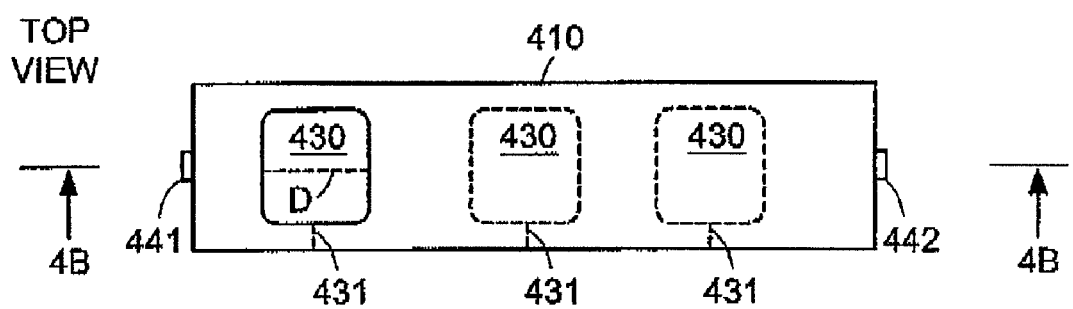
FIGS. 4A, 4B, and 4C respectively are a schematic top-view, a schematic cross-section side view (along plane B), and a cross-section end view (along plane C) of an embodiment of a portion of a plasma system.
Figure 4B:
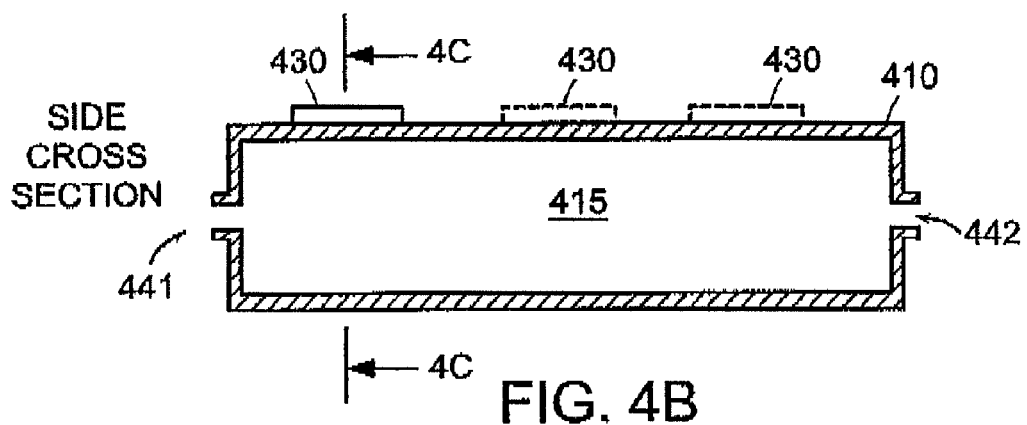
Figure 4C:
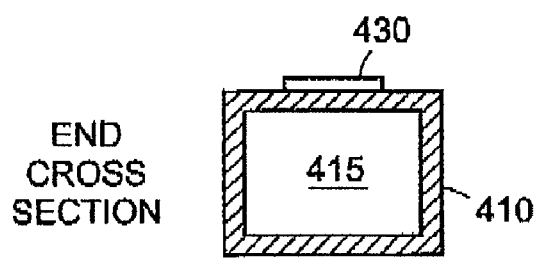
Figure 5A:
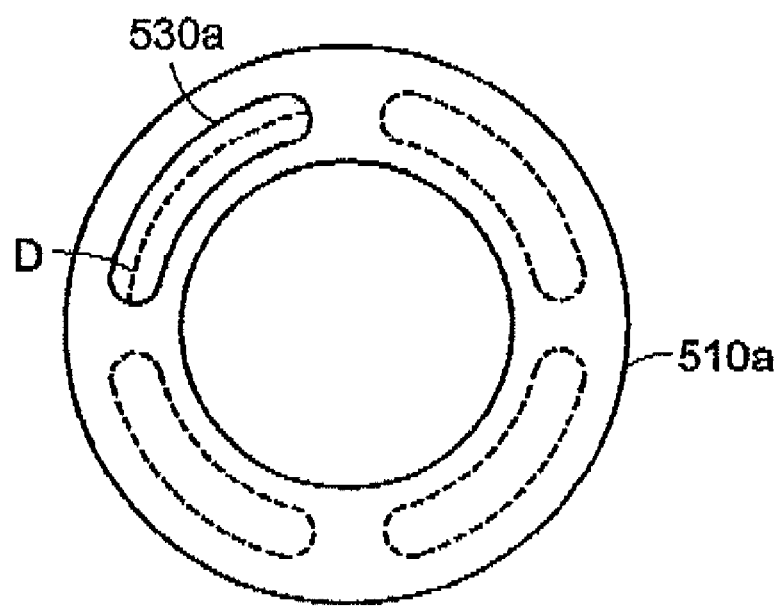
FIGS. 5A, 5B, 5C and 5D are schematic top-views of four embodiments of portions of plasma systems.
Figure 5B:
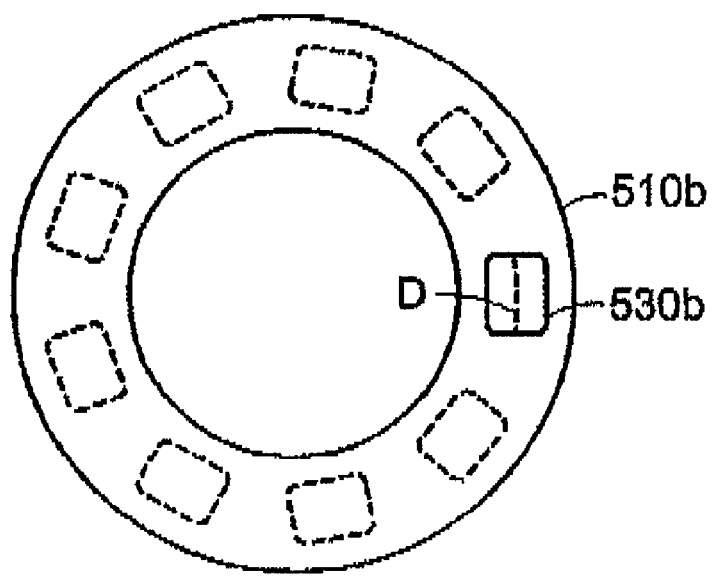
Figure 5C:
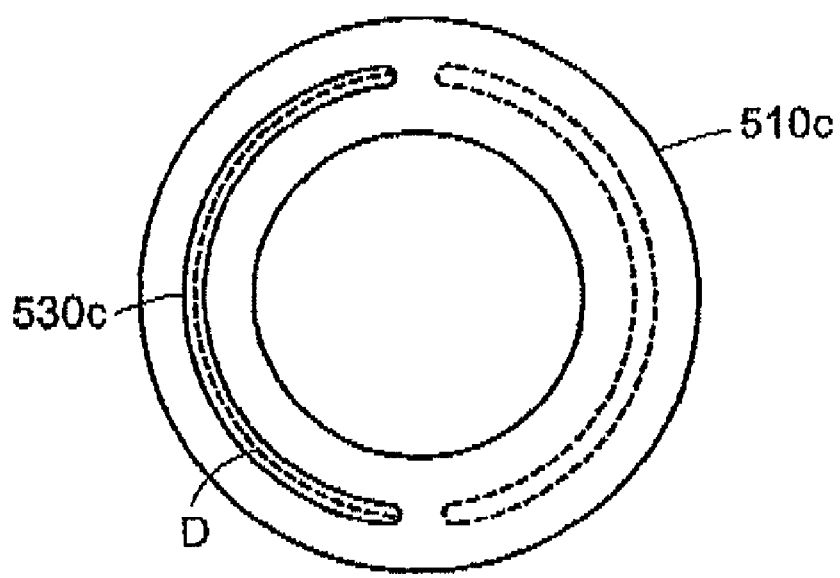
Figure 5D:
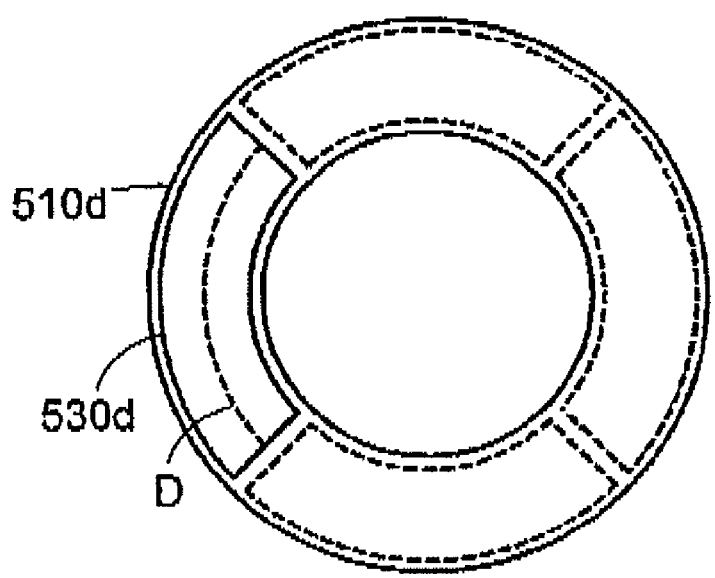

FIGS. 4A, 4B, and 4C respectively are a schematic top-view, a schematic cross-section side view (cross section through plane B), and a cross-section end view (cross section through plane C) of an embodiment of a portion of a plasma system 400. The system 400 includes a vessel 410, which defines a channel 415, and one or more ignition electrodes 430 adjacent to the vessel 410. The vessel 410 has a gas input port 441 and an output port 442.

The vessel 410 has a linear shape and defines a linear channel 415. The electrodes 430 have a square shape. Alternative embodiments of systems according to principles of the invention can include ignition electrodes of mixed sizes, shapes, and/or spacings along a vessel.

Some implementations of plasma systems that include toroidal vessels are next described. FIGS. 5A, 5B, 5C and 5D are schematic top-views of four embodiments of portions of plasma systems 500A, 500B, 500C, 500D. As illustrated, each system 500A, 500B, 500C, 500D includes a vessel 510*a*, 510*b*, 510*c*, 510*d* and at least one ignition electrode 530*a*, 530*b*, 530*c*, 530*d* adjacent to the vessel 510*a*, 510*b*, 510*e*, 510*d*. The vessels 510*a*, 510*b*, 510*e*, 510*d*, have a circular shape that defines a circular channel for a toroidal plasma. The vessels 510*a*, 510*b*, 510*e*, 510*d* can be formed entirely of a dielectric material, to obtain, for example, the benefits described above.

The ignition electrodes 530*a*, 530*b*, 530*c*, 530*d* have a dimension D, which is aligned with the channel, as described above for FIG. 3. The shape of the ignition electrodes 530*a*, 530*b*, 530*c*, 530*d* in these embodiments follows the curvature of the circular channel. Hence, the dimension D of each ignition electrode 530*a*, 530*b*, 530*c*, 530*d*, as illustrated, follows the curvature of its associated electrode 530*a*, 530*b*, 530*c*, 530*d*. Accordingly, the length of the dimension D is measured along the curved path of the dimension D.

The systems 500A, 500B, 500C, 500D, in each case, can include more than one ignition electrode 530*a*, 530*b*, 530*e*, 530*d*, as indicated by the dashed features. As described above, increases in the area, number and distribution of ignition electrodes 530*a*, 530*b*, 530*c*, 530*d* can improve the ignition performance of the systems 500A, 500B, 500C, 500D.

Figure 6:
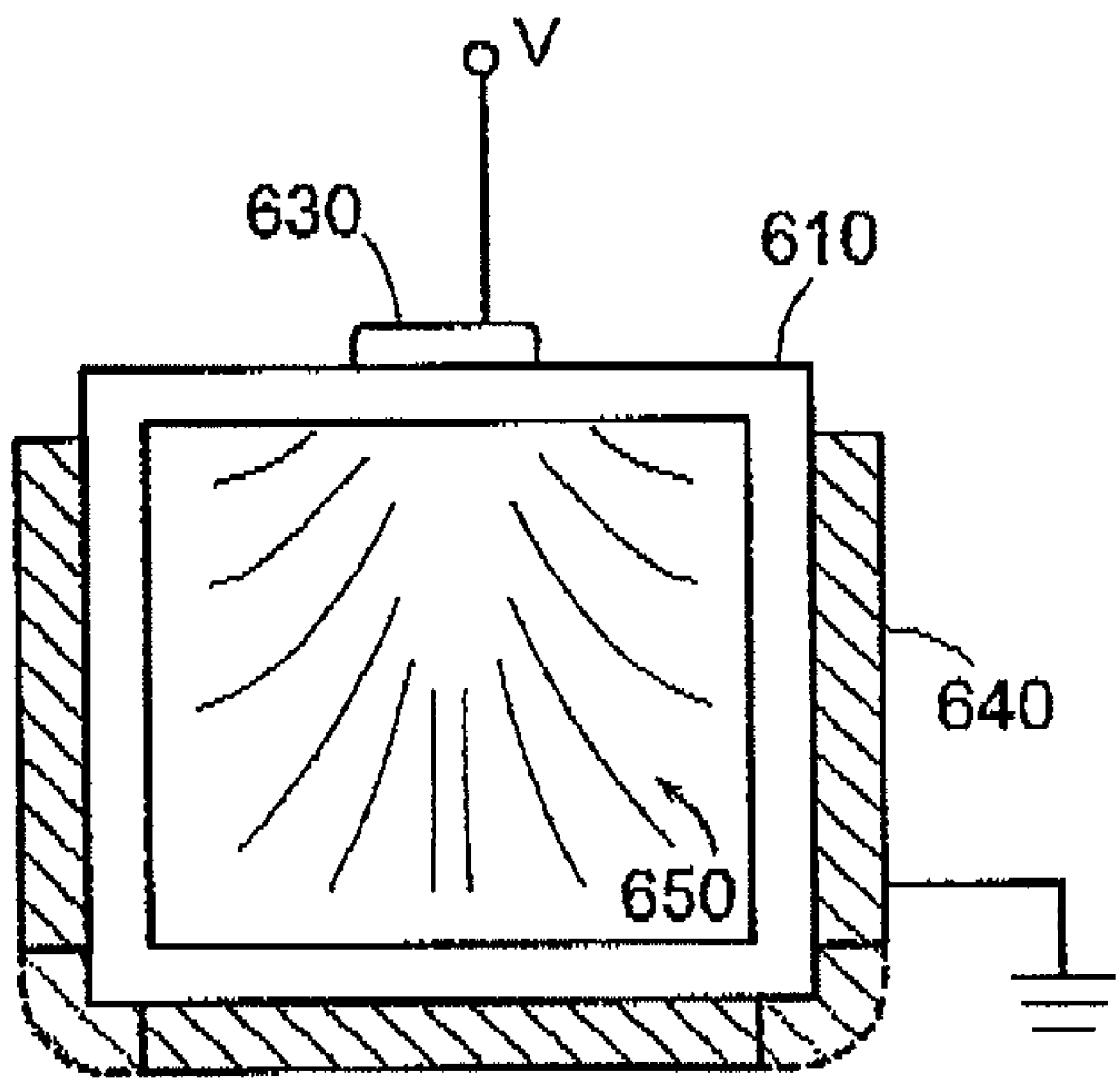
FIG. 6 is a schematic view of a cross section of a portion of an embodiment of a system that includes a vessel similar to the vessels illustrated in FIG. 5.

FIG. 6 is a schematic view of a cross section of a portion of an embodiment of a system 600 that includes a vessel 610 similar to those illustrated in FIG. 5. The system 600 also includes an ignition electrode 630 adjacent to a top surface of the vessel 610, and a reference electrode 640 adjacent to bottom and side surfaces of the vessel 610. A voltage V can be applied between the ignition electrode 630 and the reference electrode 640 to initiate a discharge in a gas in the vessel 610. Thus, during ignition, an ionizing electric field appears between the ignition electrode 630 and the reference electrode 640 (indicated by electric field lines 650).

The ignition electrode 630 can be formed, for example, from a metallic sheet and placed in position adjacent to the vessel 610. Alternatively, the electrode 630 can be formed on the vessel 610, for example, via thick or thin-film deposition techniques.

The reference electrode 640 can include separate portions on the bottom, inside and outside surfaces of the vessel 610. Alternatively, the portions can be joined (see dashed line portions) to provide a single portion that wraps around the vessel 610. The reference electrode 640 has one or more breaks located around the vessel 610, as required for the same reasons as described above for ignition electrodes.

In alternative embodiments of a system, one or more ignition electrodes are disposed adjacent to a side surface of a square cross-section donut-shaped vessel. Similarly, a reference electrode can be disposed by a top or bottom surface of such a vessel.

According to principles of the invention, use of larger ignition electrodes can improve coupling efficiency between ignition electrodes and a plasma, and can thus provide a more intense initial gas breakdown. As described below, an improved initial gas breakdown can be advantageous for a variety of processes.

A plasma in most circumstances exhibits a negative impedance, i.e., the impedance of the plasma decreases with increasing plasma density and electron temperature. An increased initial plasma density and electron temperature can reduce the level of induced electric field required to form and/or maintain the plasma. In a plasma vessel having a large or long plasma channel either of linear or toroidal shape, creating an intense substantially continuous initial breakdown along the plasma channel can ease the formation of the main plasma. Ignition benefits of the invention are helpful, for example, when igniting an electronegative gas such as fluorine or oxygen where loss of electrons may be severe due to electron attachment to gas molecules.

Plasma bombardment of the vessel surface can be reduced by quickly removing the power to the capacitively-coupled ignition electrodes after the formation of the main inductive plasma. To accomplish this, some embodiments of systems according to principles of the invention include a control circuit that removes power from the ignition electrodes once a plasma is initiated. Surface erosion can result from bombardment of energetic ions after a plasma is ignited and before the voltage to the ignition electrodes is removed. Thus, a control circuit is included to detect the ignition of the plasma either by measuring, for example, the voltage and/or current waveforms of the power supply or measuring the light emission from the plasma. The control circuit then removes power to the ignition electrodes after the plasma forms, in order to limit surface erosion.

An ignition electrode, such as electrode 630, can be formed from a metal film deposited or laminated on the surface of a dielectric plasma vessel. The metal film can include, for example, copper or aluminum, or in cases where metal diffusion or electromigration is of concern, can be made of a refractory material such as titanium, tantalum, or tungsten, or an alloy or compound conductive material such as TiN.

Figure 7:
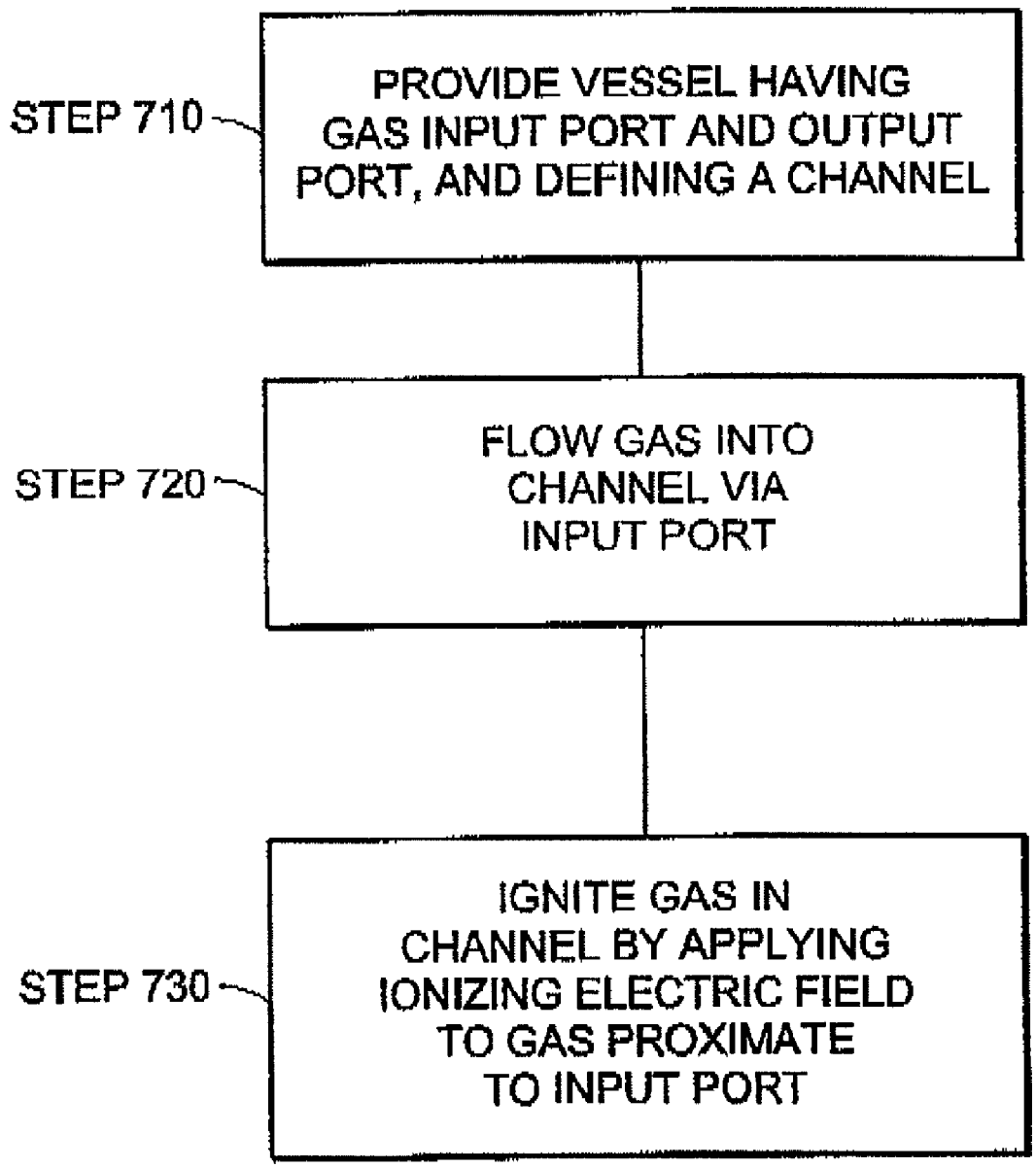
FIG. 7 is a flowchart of an embodiment of a method for dissociating gases.

FIG. 7 is a flowchart of an embodiment of a method for igniting a discharge in a gas that can initiate a plasma. The method includes providing a vessel having a gas input port and an output port (STEP 710). The vessel defines a channel for containing a gas. The method includes flowing a gas into the channel via the input port (STEP 720), and igniting the gas in the channel by applying an ionizing electric field to the gas proximate to the gas input port while the gas is flowing into the channel (STEP 730).

Figure 8:
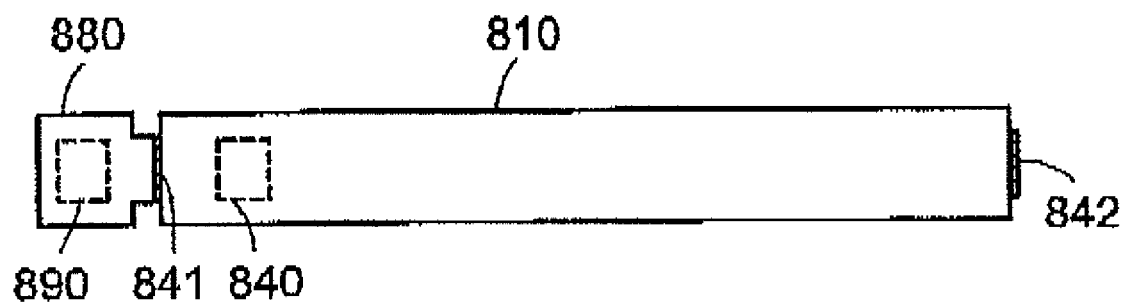
FIG. 8 is top view of an embodiment of a plasma system that includes a linear-shaped vessel having a gas input port and an output port.
Figure 9:
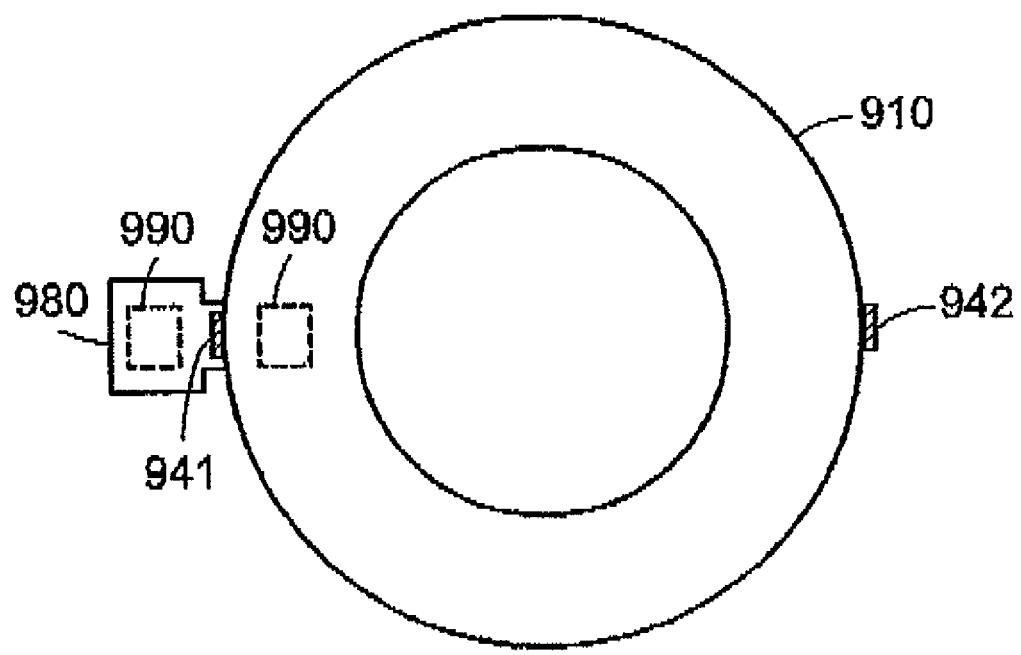
FIG. 9 is a top view of an embodiment of a plasma system that includes a toroidal-shaped vessel having a gas input port and an output port.

Referring to FIGS. 8 and 9, illustrative apparatus that can implement the method 700 are described.

FIG. 8 is an embodiment of a plasma system 800 that includes a linear-shaped vessel 810, which defines a channel for containing a gas and has a gas input port 841 and an output port 842. The system 800 includes an upstream portion 880 in fluid communication with the input port 841 of the vessel 810. The system 800 also includes at least one ignition electrode 890 adjacent to the gas input port 841 for application of an electric field to a flowing gas proximate to the input port 841 of the vessel 810 (two alternative locations for an ignition electrode 890 are indicated by with dashed-line features.)

As illustrated, the ignition electrode 890 can be located by a surface of the vessel 810 or by a surface of the upstream portion 880. The upstream portion 880 can be, for example, a flange for mating with a gas delivery pipeline. The upstream portion 880 and the vessel 810 can be formed from a single piece of material, for example, a single piece of fused quartz.

One or more ignition electrodes 890 can be upstream or downstream of the input port 841, or can overlap the input port 841. The method 700 as implemented, for example, with the system 800, can provide improved ignition. The ignition electrode 890 adjacent to the gas input port 841 can ignite a flowing gas in the vicinity of the site of gas entry into the vessel 810. The site of ignition, in cooperation with the flow of ionized components, can help to seed a plasma along the full channel.

FIG. 9 is an embodiment of a system 900 that includes a vessel 910 having a gas input port 941 and an output port 942. The vessel 910 defines a channel for containing a gas. The system includes an upstream portion 980 in fluid communication with the gas input port 941. The system 900 includes at least one ignition electrode 990 adjacent to the gas input port 941 for application of an electric field to a flowing gas proximate to the input port 941 of the vessel 910.

The system 900 has features similar to that of the system 800, however, with the linear vessel 810 replaced with the toroidal-shaped vessel 910. The system 900 can implement the method 700, and provide the benefits described with respect to FIG. 8.

As indicated above, an upstream ignition site can seed electrons into an incoming gas stream. The electrons can then flow with the gas along the channel and assist, for example, inductive ignition of a plasma. The method 700 and systems 800, 900 can provide reduction of plasma system manufacturing costs, easier field service, and provide reduced erosion of an inner surface of a vessel 810, 910.

Figure 10:
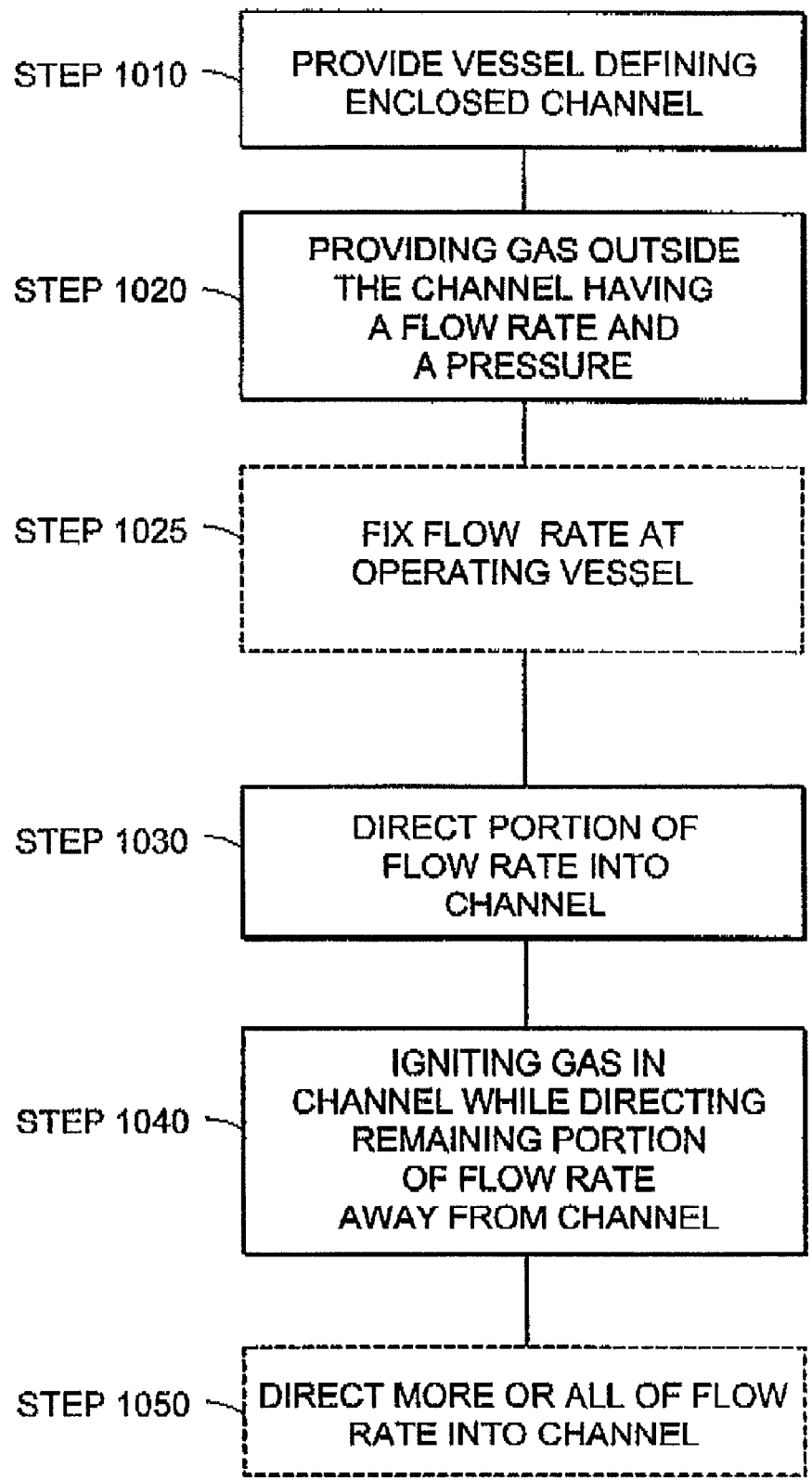
FIG. 10 is a flowchart of an embodiment of a method for dissociating gases.
Figure 11:
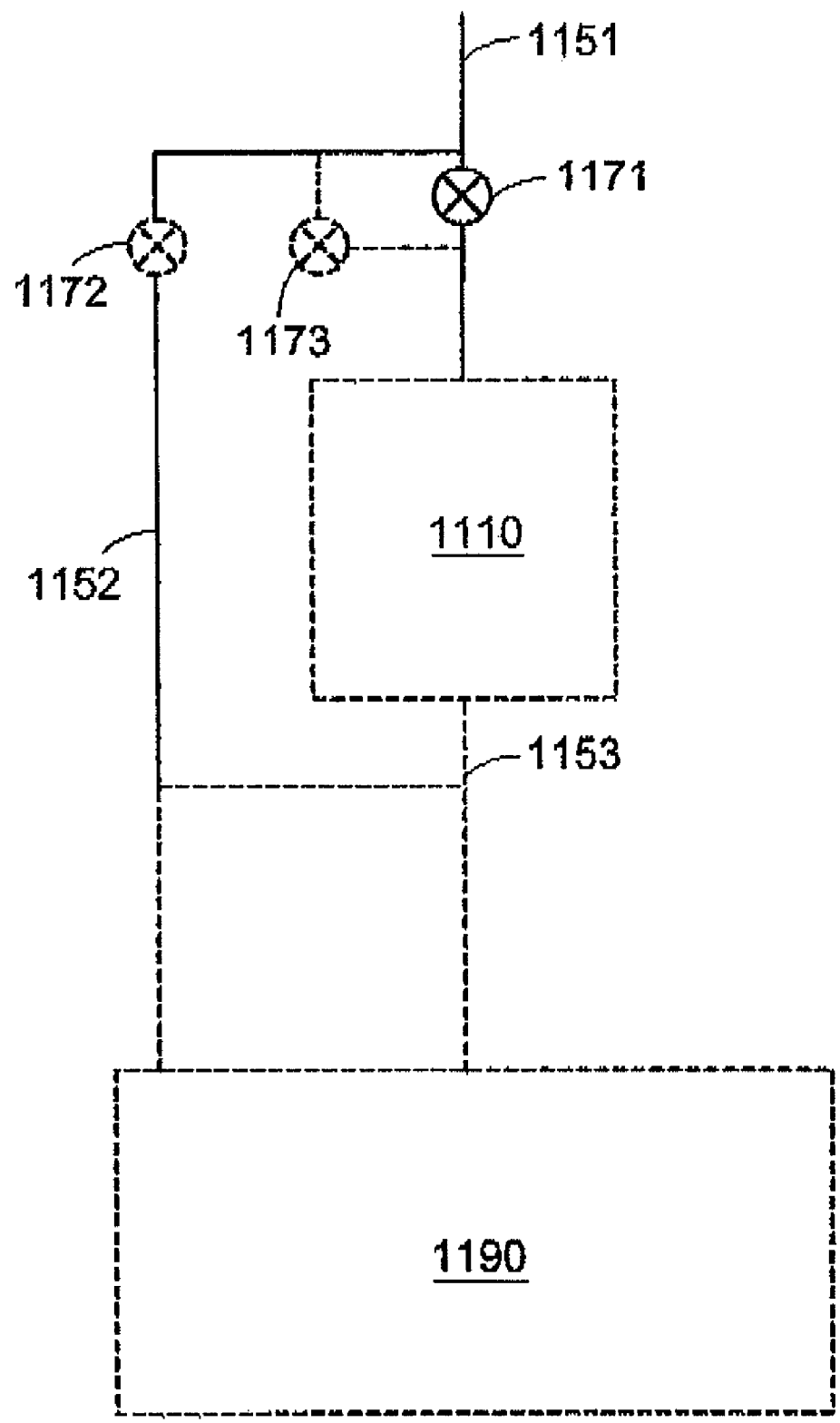
FIG. 11 is a block diagram of an embodiment of a plasma system that can implement the method of FIG. 10.

Referring now to FIGS. 10 and 11, aspects of the invention that relate to ignition facilitated by gas-bypass features of a plasma system are described.

FIG. 10 is a flowchart of an embodiment of a method 1000 for igniting gases to initiate a plasma. The method 1000 includes providing a vessel defining an enclosed channel (STEP 1010), providing a gas having a flow rate and a pressure outside of the channel (STEP 1020), directing a portion of the flow rate of the gas into the channel (STEP 1030), and igniting the gas in the channel while directing a remaining portion of the flow rate away from the channel (STEP 1040).

Bypass of a portion of the gas flow during ignition can extend, for example, the range of flow rates and pressures that can be successfully ignited. Ignition of gas in the channel is eased by limiting the portion of the flow rate that enters the channel during ignition. For example, the portion of the flow rate can be as small as zero (i.e., stagnant gas in the channel).

At the same time, the pressure in the channel can be the same as the pressure of the gas outside of the channel. For example, the pressure can be a desired operational pressure for use after the plasma is ignited.

The method 1000 can include fixing the flow rate at a value for operation of the vessel prior to igniting the gas (STEP 1025). Setting the flow rate at a flow rate desired for operation after a plasma is formed in the channel can provide improved system stability. Thus, for example, a gas flow rate provided by a gas source can be stabilized at use conditions, and a use pressure can be stabilized in the channel, all prior to ignition.

The method 1000 can also include directing an increased portion or all of the flow rate into the channel after igniting the gas in the channel (STEP 1050). Thus, the transition from ignition to operating plasma conditions can be quick and stable in comparison to prior methods.

FIG. 11 is a block diagram of an embodiment of a plasma system 1100 that can implement the method 1000. The system 1100 includes a gas input pipeline 1151, a bypass valve 1171 controlling flow through the pipeline 1151, and a bypass gas pipeline 1152. To implement the method 1000, the bypass valve 1171, for example, can direct some or all of a gas flow rate from the input pipeline 1151 to the bypass gas pipeline 1152.

The input pipeline 1151 can be in fluid communication with a vessel 1110. The system 1100 can include a process chamber 1190 and a plasma product output pipeline 1153 in communication with the vessel 1110 and the chamber 1190.

The system 1100 can include an orifice 1173 to limit both transient and steady-state gas flow. The orifice 1173 can aid in providing redirection of the portion of the gas flow in the bypass pipeline 1152 to the gas input pipeline 1151.

The system can include a valve 1172 in the bypass pipeline 1152. The bypass pipeline 1152 can be in fluid communication with the plasma product output pipeline 1153, the chamber 1190, and/or with an exhaust port.

It will be apparent to one having skill in the plasma system arts that various numbers, types and locations of valves and orifices can be used to implement the method 1000. For example, alternative implementations related to the system 1100 can include: a single bypass valve, a single bypass valve and an orifice; two bypass valves; and two bypass valves and an orifice.

The method 1000 can provide ignition when the gas input pipeline 1151 is delivering, for example, a process gas at high flow rate and high pressure use conditions. For example, the gas input line can provide a gas at a pressure of 2 torr with the gas including a mixture of $O_2$ and $N_2$, a combined flow rate of the $O_2$ at 6 slm (standard liters per minute) and the $N_2$ at 0.6 slm. The method 1000 can provide reliable ignition, for example, under these conditions.

Figure 12:
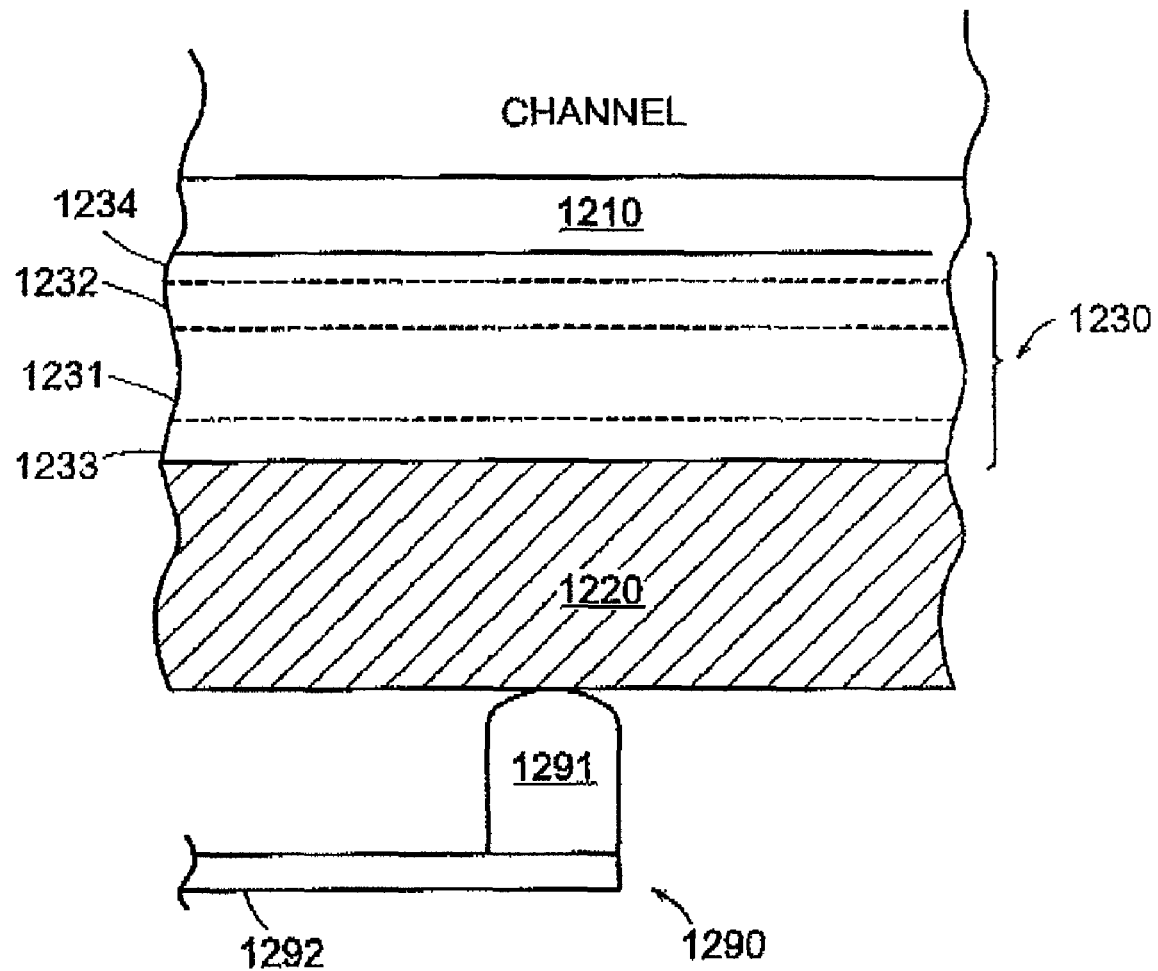
FIG. 12 is a cross-sectional diagram of a portion of an embodiment of a system that includes components that assist transfer of heat away from a plasma vessel.
Figure 13:
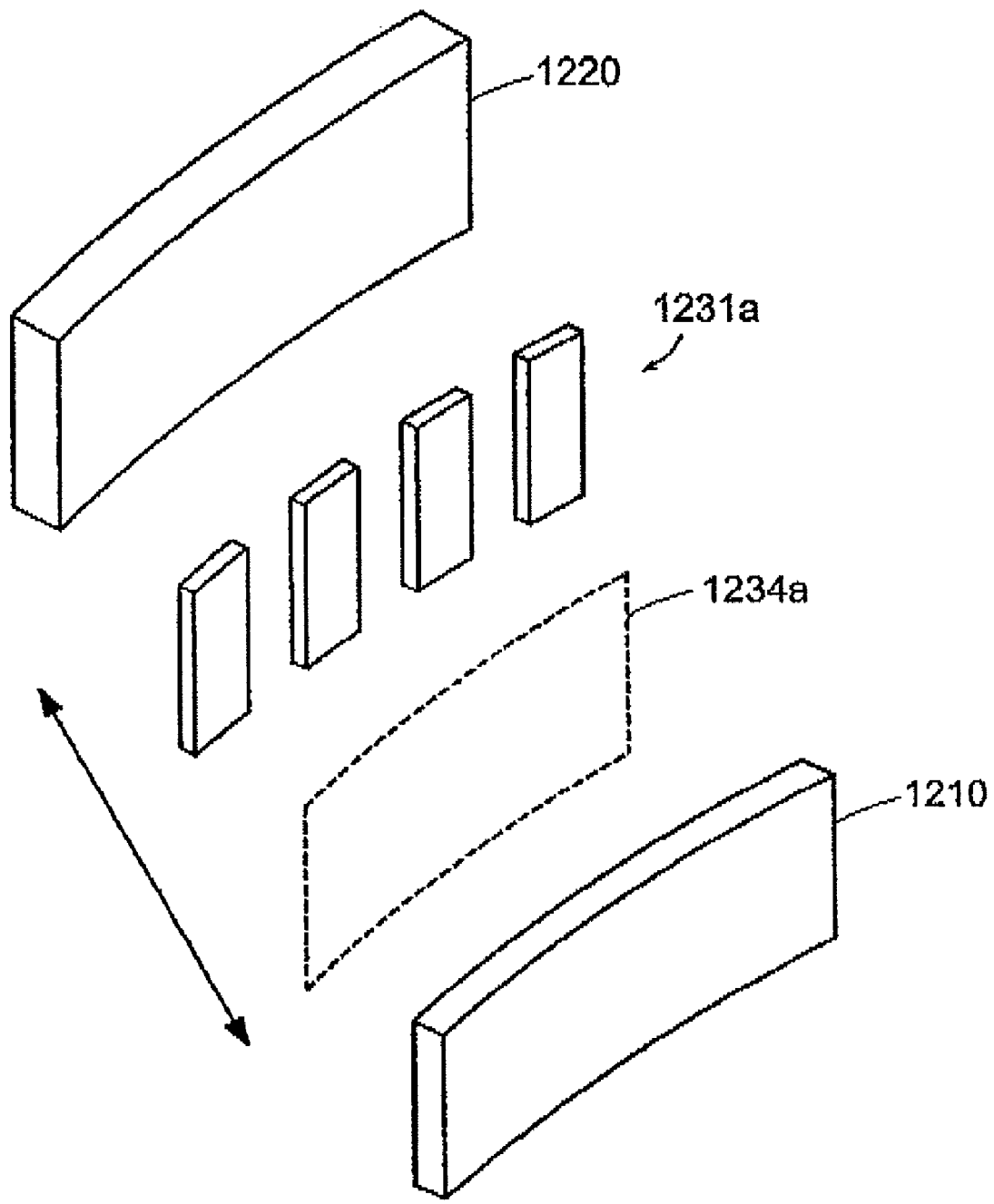
FIG. 13 is an exploded view of a portion of the vessel of FIG. 12 and cooling-related components.

Referring to FIGS. 12 to 14, methods and apparatus for improved cooling of plasma systems, such as those described above, are described next. Cooling features, according to principles of the invention, are of particular benefit when applied to dielectric plasma vessels.

FIG. 12 is a cross-sectional diagram of a portion of an embodiment of a system 1200 that includes components that assist transfer of heat away from a plasma vessel. The system 1200 includes a vessel 1210, a heat sink 1220 adjacent to the vessel 1210, and a thermal interface 1230 (also referred to herein as a mechanical-accommodation layer) disposed between the vessel 1210 and the heat sink 1220. The heat sink 1220 can also serve as an electrode, for example, the ignition electrode 630 and/or the reference electrode 640 (see FIG. 6.) The heat sink may be cooled by a cooling fluid, such as water, oil or air, flowing through, on or adjacent to the heat sink.

The system 1200 optionally includes a spring-loaded mechanism 1290 that controllably applies pressure to the heat sink 1220. Some implementations of the spring-loaded mechanism 1290 are described below.

The thermal interface 1230 can include a material having a homogeneous content. For example, the material of the thermal interface 1230 can be a single material or a mixture of materials, for example, a composite or laminate material. The thermal interface 1230 can be discontinuous or can uniformly fill the space between the heat sink 1220 and the vessel 1210. In some alternative embodiments, one or more vias are included in the thermal interface 1230 to provide an avenue for electrical contact to an ignition electrode lying between the thermal interface 1230 and the vessel 1210.

The thermal interface 1230 has one or more mechanical properties, which may permit the thermal interface to accommodate pressure, and variations in the pressure, applied by the heat sink 1220. The properties can include elastic and plastic deformation behaviors. The thermal interface 1230 can have varying degrees of elasticity and flexibility. For example, the thermal interface 1230 can be deformable. A deformable behavior can help to accommodate thermally induced dimensional changes of the system 1200.

The thermal interface 1230 can be a composite or laminate that includes materials having different thermal and mechanical behaviors. For example, the thermal interface 1230 can include polymeric and metallic components to obtain, for example, deformation behavior of the former and thermal conductivity behavior of the latter.

In some alternative embodiments of the system 1200, the thermal interface 1230 includes more than one layer. In such embodiments, the thermal interface 1230 includes a deformable portion 1231 in mechanical communication with both the heat sink 1220 and the vessel 1210 at a plurality of contact locations. The deformable portion 1231 can be rigid or flexible, and can be elastically and/or plastically deformable. For example, the deformable portion 1231 can be deformable to help accommodate assembly and/or accommodate dimensional changes in the system 1200 due to, for example, thermal effects.

The thermal interface 1230 can include additional portions 1232, 1233, 1234 that can, in part, mediate contact between the deformable portion 1231 and the heat sink 1220 and/or the vessel 1210. Some implementations of the additional portions 1232, 1233, 1234 are described below.

The elastic portion of the thermal interface 1230, the heat sink 1220, and the vessel 1210 define a space between the heat sink 1220 and the vessel 1210. The space can accommodate component movement due to thermal effects. The space can enhance the range of deformation of the elastic portion of the thermal interface 1230.

Referring to FIGS. 13 and 14, the deformable portion 1231 can include a variety of materials and structures. FIG. 13 is an exploded view of a portion of the vessel 1220 and cooling-related components of a more detailed implementation of the plasma system 1200 of FIG. 12. In this implementation, the deformable layer 1231 is an elastomer layer 1231*a*. The elastomer layer 1231*a* includes spaced portions of an elastomeric material. Alternatively, the deformable layer 1231 can be a conformable layer that conforms to a surface or surfaces of neighboring materials.

The thermal interface 1230 can also include a light-blocking layer 1234*a* to block, for example, UV light emitted by the plasma from reaching and damaging the elastomeric material. UV light can also cause undesirable ozone formation. The light-blocking layer 1234*a* can also aid cooling of the vessel 1210.

The light block layer 1234*a* can be, for example, a thin sheet of material, or can be a coating applied, for example, to the vessel 1210. The light-blocking layer 1234*a* can be formed from a metal, such as copper, or other appropriate material.

The elastomeric material can be partially filled with ceramic or metallic materials. Such materials can include, for example, aluminum oxide, aluminum nitride, boron nitride, diamond, and graphite, which can modify the thermal and mechanical properties of the elastomeric material.

The configuration of the elastomer layer 1231*a* can permit deformation in response to tensile, compressive and/or shear stresses. The elastomer layer 1231*a* can alternatively include slits and/or voids.

The elastomer layer 1231*a* can be derived from a sheet of material, or can be formed as a potted compound. A thickness of the elastomer layer 1231*a* can be in a range of 25 micrometers or less to 2 millimeters or greater. In preferred implementations, the elastomer layer 1231*a* covers approximately 25% to 100% of the exterior surface area of the vessel 1210.

In another implementation of the system 1200 of FIG. 12, the thermal interface 1230 includes a wool, such as a copper wool, a sintered metal, a patterned metal, and/or a spring. Metallic materials can provide a greater thermal conductivity and greater temperature rating than available from many elastomeric materials.

Figure 14A:
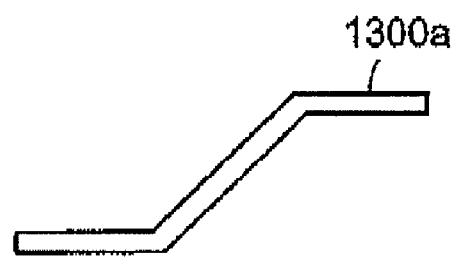
FIGS. 14A and 14B are side views of embodiments of elastic forms that can be included in an elastic portion of a thermal interface.
Figure 14B:
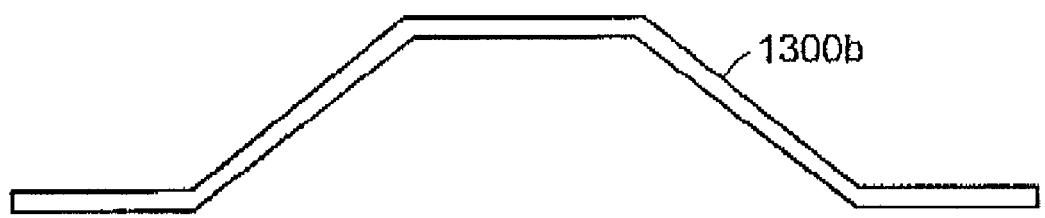
Figure 14C:
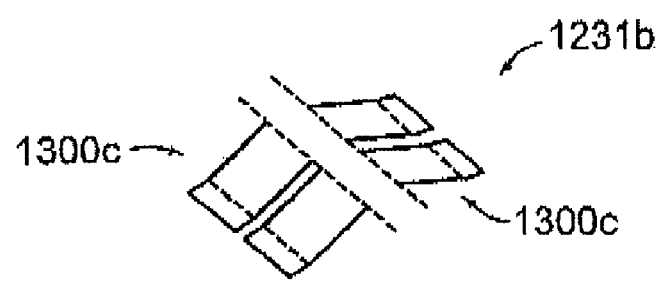
FIG. 14C is an angled three-dimensional view of an embodiment of a spring portion that can serve as an elastic portion of a thermal interface.

Referring to FIGS. 14A, 14B, and 14C, some implementations of the elastic portion 1231 that can be formed from a metal are described.

FIGS. 14A and 14B are side views of embodiments of elastic forms 1300*a*, 1300*b* that can be included in the deformable portion 1231 of the thermal interface 1230. The elastic forms 1300*a*, 1300*b*, as illustrated or in various other shapes, can flex in response to the above-described thermally induced component movement. The elastic forms 1300*a*, 1300*b* can be formed from a metallic material.

FIG. 14C is an angled three-dimensional view of an embodiment of a spring portion 1231*b* that can serve as the deformable portion 1231 of the thermal interface 1230. The portion 1231*b* includes multiple cantilevered fingers. The fingers can be formed from, for example, copper or beryllium-copper. The cantilevered fingers can be formed by, for example, electrochemical etching followed by plastic deformation of the fingers to give them a final shape. Plastic deformation of the deformable portion 1231 can occur during final fit to the vessel 1210. The spring portion 1231*b* can be brazed or soldered or adhesively bonded to the heat sink 1220 and/or to the vessel 1210 to, for example, assist heat transfer. In some implementations, the portion 1231*b* provides a gap thickness of approximately 0.25 to 25.0 millimeters.

Alternatively, the thermal interface 1230 can include both elastomeric and metallic components. For example, either or both of additional portions 1232, 1233 can be elastomeric layers that are included to mediate contact between the spring portion 1231*b* and the heat sink 1220 and the vessel 1210. Such a configuration can provide at least two advantages: (1) the thermal conductivity and high temperature tolerance of some metallic materials; and (2) the compliant, elastic and interfacial properties of some elastomeric materials.

The thermal interface 1230 can also serve as a spacer to provide a gap having a controlled thickness between the vessel 1210 and the heat sink 1220. The space can be filled with a gas (for example, air or He.) A gas can support heat transfer, for example, across a thickness of less than approximately 100 micrometers. Further improvements can be obtained with thicknesses of less than 25 micrometers, and less than 12 micrometers. Alternatively, the space may be filled with a fluid or semi-fluid (such as a grease) to assist heat transfer, the volume of fluid being small due to the small gap thickness.

The heat sink 1220 (also herein referred to as a cooled shell) can be in close proximity to the vessel 1210, and can be directly cooled by a circulating fluid and/or cooled conductively through another thermal interface to another cooled surface. The heat sink 1220 can also be cooled by air. The heat sink 1220 can be formed, for example, from any combination of metals, ceramics and composite materials (e.g., copper, aluminum, brass, aluminum nitride, aluminum silicon carbide, and metal matrix ceramic composites.)

If the heat sink 1220 is formed from an electrically conductive material, then at least one dielectric gap should exist in the heat sink 1220 for a toroidal-shaped vessel 1210. Multiple dielectric gaps in the heat sink 1220 can be included to reduce the peak electric fields across the dielectric gaps. Due to the physical proximity between the heat sink and the plasma vessel 1210, electric fields at the dielectric gaps of the heat sink may couple to the plasma vessel 1210 and cause localized high electric fields in the plasma vessel 1210 and corresponding plasma damage. Using a heat sink 1220 with more than one electric gap can distribute the induced electric field across multiple gaps, thereby reducing the peak electric fields and lowering the plasma damage. Forming the heat sink 1220 from multiple heat sink portions may also simplify assembly of the plasma system 1200.

The heat sink 1220 can be formed from multiple rigid segments. Alternatively, the heat sink can be formed from multiple compliant segments to further help accommodate thermally induced size and shape changes.

The heat sink 1220 preferably includes at least two segments that enclose substantially all of the vessel 1210. Segmentation of the heat sink 1220 can aid assembly of a system 1200 that includes a vessel 1210 having a complex shape such as a toroidal shape. For a toroidal dielectric vessel, the two segments can be "C" shaped to provide a gap in the assembled heat sink 1220. The heat sink 1220 may be made of an electrically conductive material such as copper or aluminum. For a toroidal vessel having a square cross-section, as indicated for example in FIG. 6, the heat sink 1220 preferably includes sixteen segments, that is, four segments for each of four "surfaces" of the toroid shape (i.e., top, bottom, inner, and outer portions of the toroidal shape.)

Referring again to FIG. 12, and as mentioned above, the system 1200 can include a spring-loaded mechanism 1290 to maintain the heat sink 1220 and the thermal interface 1230 in compression against the outside of the plasma vessel 1210. The spring-loaded mechanism 1290 can include a heat sink contact 1291, such as a screw or clamp, and a spring 1292.

The spring 1292 applies pressure to the heat sink 1220 via the contact 1291. The applied pressure can be selected to maintain and control mechanical and thermal interactions among the vessel 1210, the thermal interface 1230 and the heat sink 1220. One or more clamps or screws 1291 can be utilized.

The one or more springs 1292 accommodate dimensional changes that arise from thermal effects. Thus, an applied pressure can be maintained at an effectively constant level during temperature variations. The spring-loaded mechanism 1290 can be tightened to obtain a desired force that is then maintained by the action of the one or more springs 1292.

The spring-loaded mechanism 1290 can controllably apply pressure to the thermal interface 1230 between, for example, a dielectric toroidal vessel and the heat sink 1220. The thermal interface 1230 is actively compressed by the spring-loaded mechanism 1290 to maintain thermal contact between the vessel 1210 and the heat sink 1220.

A toroidal dielectric plasma vessel has a relatively complicated geometry and may have a thin wall to promote heat removal. The dielectric plasma vessel may also be made from a material that does not have thermal-mechanical properties that are compatible with heat sink materials. An implementation of the plasma system 1200 that includes such a vessel can advantageously include a heat sink 1220 that is segmented, as described above.

In one preferred implementation of the system 1200, the system 1200 has a heat sink 1220 that is segmented and covers most or all faces of the vessel 1210 that in this implementation is formed from a dielectric material; the heat sink 1220 is compressed against the vessel 1210 with a controlled amount of force using the spring-loaded mechanism 1290; the thermal interface 1230 conforms to the vessel 1210. This implementation of the system 1200 provides a reliable toroidal plasma source having a dielectric plasma vessel.

Figure 15:
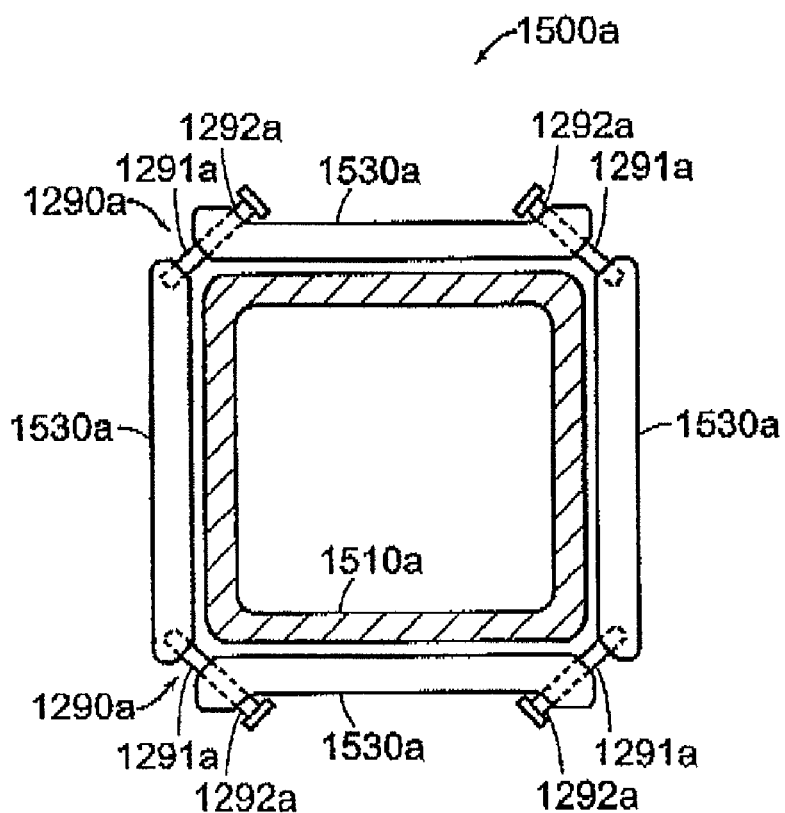
FIG. 15 is a cross-sectional diagram of a portion of an embodiment of a plasma system including a square cross-section vessel and four heat-sink segments joined to each other by spring-loaded mechanisms.

FIG. 15 is a cross-sectional illustration of a portion of an embodiment of a plasma system 1500a. The system 1500a includes a square cross-section vessel 1501a and four heat-sink segments 1530a joined to each other by spring-loaded mechanisms 1290a. A spring-loaded mechanism 1290a includes a screw 1291a that screws into one of the segments 1520a and a spring 1292a that is located between a head of the screw 1291a and a neighboring segment 1530a. Alternative configurations of the spring-loaded mechanisms 1290a will be apparent to one having ordinary skill in the relevant art.

The combination of heat-sink segments 1530a and spring-loaded mechanisms 1290a provides a self-supporting cooling shell. The self-supporting cooling shell supports effective cooling of the vessel 1501a while accommodating thermal-mismatch induced dimensional changes of the combined vessel 1501a and cooling shell.

Figure 16:
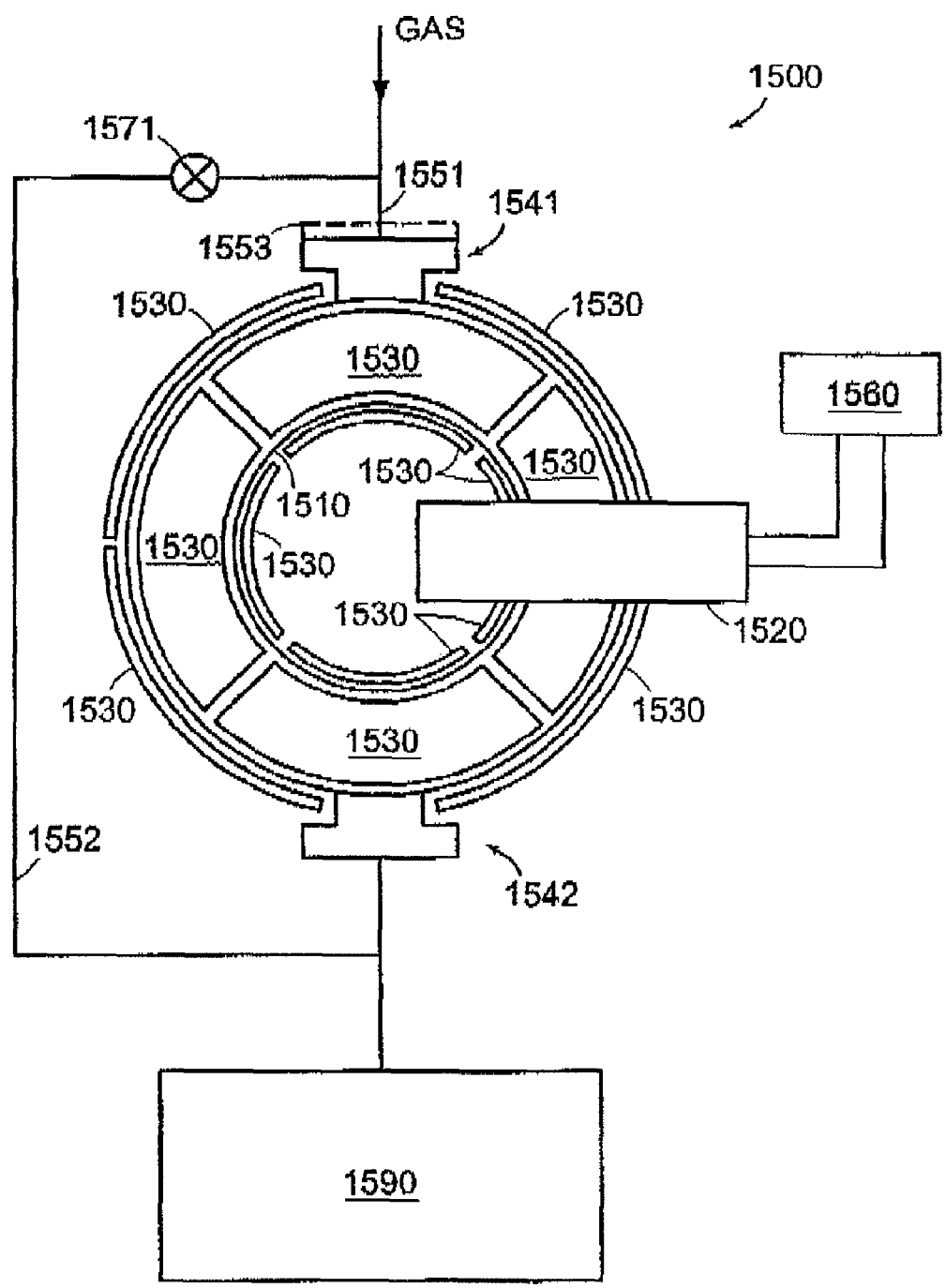
FIG. 16 is a block diagram of an embodiment of a plasma processing system.

FIG. 16 is a block diagram of an embodiment of a plasma processing system 1500 that includes structural features of the invention described above, and that can implement the method 1000. The system 1500 includes a dielectric vessel 1510 surrounded by at least one magnetic core 1520 that is in electrical communication with an AC power supply 1560. The dielectric vessel 1510 has a gas input port 1541 and an output port 1542. Sixteen heat-sink segments 1530 are positioned around the dielectric vessel 1510, and can also serve as electrodes, e.g., ignition and/or reference electrodes. Alternatively, ignition and/or reference electrodes can reside between the segments 1530 and the vessel 1510.

The one or more magnetic cores 1520 have windings that act as primaries of a transformer to induce an electric field and a plasma current aligned with the channel defined by the dielectric vessel 1510. A plasma in the channel completes a secondary circuit of the transformer. Some implementations of magnetic cores and associated AC power supplies that can support a toroidal plasma are described in U.S. Pat. No. 6,150,628 to Smith et al.

The vessel 1510 has a square cross section, and four of the heat-sink segments 1530 are adjacent to each of four surfaces defined by the vessel 1510 (i.e., upper, lower, inner, and outer surfaces.) The segmentation of the heat sink aids assembly and accommodates thermally induced dimensional changes.

The system 1500 also includes a gas input pipeline 1551 in communication with the input port 1541, a bypass gas pipeline 1552, a bypass valve 1571, and a process vessel 1590 defining a process chamber in communication with the output port 1542 of the dielectric vessel 1510. To implement the method 1000, the bypass valve 1571 can direct a portion or all of a gas flow from the input pipeline 1551 to the bypass gas pipeline 1552 during plasma ignition. The system 1500 can include a gas showerhead 1551 in or near the input port 1541 to mediate flow of gas from the pipeline 1151 into the input port 1541.

The inclusion of the gas showerhead 1551 can improve stability of a plasma and the uniformity of heat distribution onto the inside surface of the vessel. The gas showerhead 1551 can improve the distribution of gas directed through input port 1541 into the toroidal channel.

Figure 17A:
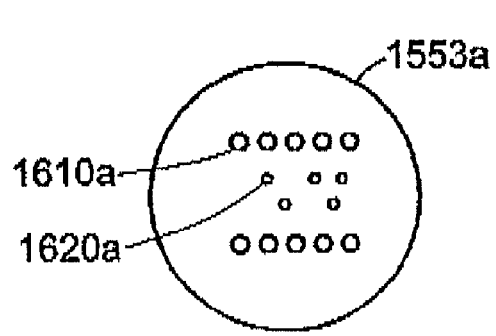
FIGS. 17A and 17B are planar views of embodiments of gas inlet showerheads.
Figure 17B:
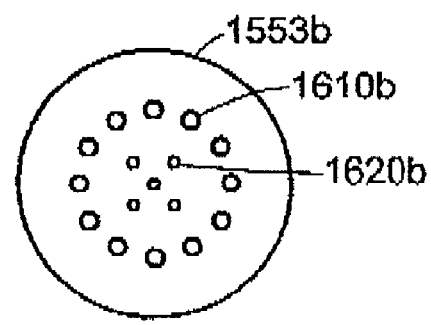

FIGS. 17A and 17B illustrate examples of gas showerheads that are configured to direct gas flow primarily along surfaces of a plasma vessel. FIG. 17A illustrates an embodiment of a gas showerhead 1553a that can be used, for example, as the showerhead 1553 of the system 1500 of FIG. 16. The showerhead 1553a defines rows of apertures 1610a to either side of smaller/and or fewer apertures 1620a. Most of the inlet gas passes through rows of apertures 1610a and along the upper and lower inner surfaces of a vessel in or near to the gas inlet port 1541.

FIG. 17B illustrates an embodiment of a gas showerhead 1553b that can be used, for example, in conjunction with a vessel having a circular cross section. The showerhead 1553b defines a ring of apertures 1610b that surround smaller/and or fewer apertures 1620b. Most of the inlet gas passes through the ring of apertures 1610b and along an inner surface of the vessel. Improved gas distribution provided by one or more gas showerheads can provide improved stability of a plasma and more uniform power distribution in a vessel. Showerheads that limit creation of turbulence can reduce erosion of a vessel wall.

An induced electric field can be greatest at an inner radius of an inductively-coupled toroidal plasma vessel, resulting in higher heat distribution at the inner radius wall. Because a plasma can tend to remain in the center of a toroidal plasma channel, injecting inlet gas along the side walls of the plasma channel can reduce displacement of the plasma towards the inner radius wall. Flowing the inlet gas around the toroidal plasma towards the inner radius wall can also lift the plasma from the inner surface, resulting in more uniform heat distribution to the wall surfaces and lowering the peak power dissipation on the surface of the plasma vessel.

When the plasma system 1500 includes a fused quartz vessel, the system 1500 is preferably operated under conditions that limit the maximum temperature of the inside of the quartz plasma vessel to approximately 900 to 1000° C., for example, less than 950° C. At relatively high temperatures, microscopic changes including damage can appear on the inner surface of the quartz. Such microscopic changes may lead to undesirable particulate and other contamination.

Heating of the vessel can be greatest at the point where an inlet gas tends to push a plasma toward the vessel's inner surface. Moreover, a greater interaction of the plasma with the inner surface can exacerbate heat-related surface damage. Hence, it can be desirable to maintain such locations at a lower temperature than found at other positions along the vessel. For example, it can be desirable to maintain these critical wall surfaces at temperatures less than 950° C. while permitting the remainder of the wall surfaces to reach temperatures close to or greater than 950° C.

Figure 18A:
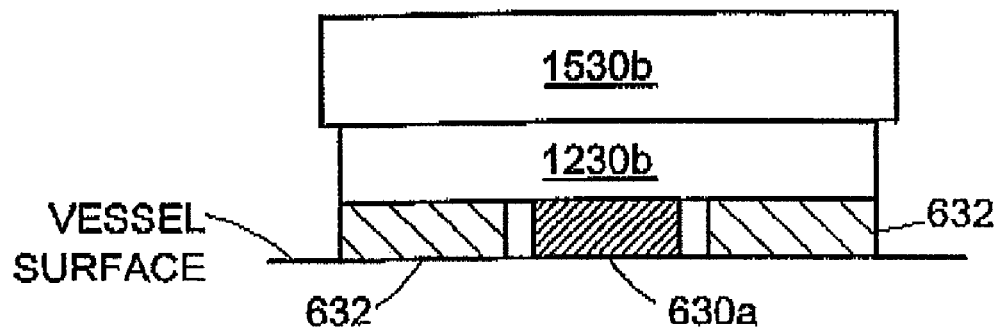
FIGS. 18A and 18B are cross-sectional views of embodiments of ignition electrodes and neighboring portions of plasma systems.
Figure 18B:
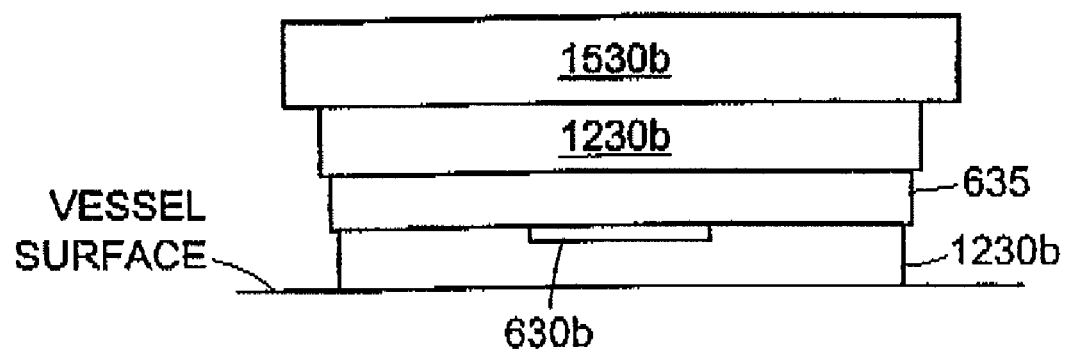

Now referring to FIGS. 18A and 18B alternative implementations of ignition electrodes can improve the performance of a thermal layer 1230. FIG. 18A illustrates a cross-sectional view of a portion of an embodiment of a plasma system. The system includes an ignition electrode 630a on or adjacent to a vessel surface, a thermal interface 1230b, a heat sink 1530b, and electrode spacers 632. The spacers 632 can fill gaps created by the electrode 630a between the thermal interface 1230b and vessel surface.

FIG. 18B illustrates a cross-sectional view of a portion of an embodiment of a plasma system. The system includes an ignition electrode 630b on a ceramic substrate 635. The combined electrode 630b and ceramic substrate 635 are placed on or adjacent to a vessel surface. The system can include a thermal interface 1230b disposed between a heat sink 1530b and the ceramic substrate 635. A second thermal interface 1230b can be disposed between the vessel surface and the ceramic substrate 635. The second thermal interface 1230b can have a conformal property to permit the second thermal interface 1230b to conform to the surface of the combined ignition electrode 630b and ceramic substrate 635.

The ignition electrode 630b can be a metal film deposited or laminated on the ceramic substrate 635. A ceramic material having a high thermal conductivity, such as AlN or $AL_2O_3$, is preferred as the substrate material. A thermally conductive ceramic substrate 635 can reduce the thermal gradient between the dielectric plasma vessel and the heat sink 1530b, while providing electric insulation between electrode 630b and heat sink 1530b. The ceramic substrate 635 can also, for example, improve the reliability of the thermal interface 1230b.

Another implementation of the invention features an integrated toroidal plasma system including a plasma source section, having a dielectric toroidal vessel, and an on-board AC power supply; the plasma source section is detachable from the device. The plasma vessel and associated cooling structure are configured to permit removal from the device chassis without disassembly of the on-board power supply. This allows the plasma vessel to be swapped at a system user's site as a consumable component of the system.

While the invention has been particularly shown and described with reference to specific preferred embodiments, it should be understood by those skilled in the art that various changes in form and detail may be made therein without departing from the spirit and scope of the invention as defined by the appended claims. For example, rather than ignition electrodes of a particular size or length, a system can include two or more ignition electrodes of any dimension and spaced along a vessel to effectively support distributed ignition. The electrodes can be spaced, for example, with a maximum distance between the edge of one electrode and the edge of a neighboring electrode of not greater than five centimeters.

What is claimed is:

1. A plasma ignition apparatus for a toroidal, inductively coupled plasma processing system, the apparatus comprising:
   a vessel defining an enclosed channel; and
   at least one capacitively coupled ignition electrode adjacent to the vessel and having a dimension aligned with an adjacent portion of the channel, a total length of the dimension of the at least one ignition electrode being greater than 10% of a length of the channel,
   wherein the at least one ignition electrode can apply an electric field to a gas in the channel to initiate plasma discharge of the gas.

2. The apparatus of claim 1, wherein the channel defines a toroidal shape, and the total length of the channel is a length of one circuit around the toroidal shape.

3. The apparatus of claim 1, wherein the total length of the dimension of the at least one ignition electrode is greater than 20% of the total length of the channel.

4. The apparatus of claim 1, wherein the vessel consists of a dielectric material.

5. The apparatus of claim 1, wherein the vessel comprises at least one metallic portion, and at least one dielectric portion that fills a gap in the metallic portion.

6. The apparatus of claim 1, wherein the at least one ignition electrode comprises at least two ignition electrodes spaced from each other.

7. The apparatus of claim 6, wherein the at least two ignition electrodes are spaced along the channel.

8. The apparatus of claim 7, further comprising an ignition control circuit that is configured to remove the electric field after a plasma is ignited in the vessel.

9. The apparatus of claim 1, further comprising a reference electrode adjacent to the vessel, wherein the at least one ignition electrode and the reference electrode cooperate to apply an electric field to the gas in the channel to initiate plasma discharge of the gas.

10. The apparatus of claim 9, wherein the reference electrode is in thermal communication with the vessel to effectively limit a temperature of the vessel.

11. The apparatus of claim 9, wherein the vessel has at least four surfaces, the reference electrode covers at least a portion of three of the four surfaces, and the ignition electrode covers at least a portion of a remaining surface of the at least four surfaces of the vessel.

12. The apparatus of claim 1, wherein a cross section of the vessel has a straight portion.

13. The apparatus of claim 12, wherein a cross section of the vessel has a rectangular shape.

14. The apparatus of claim 12, wherein the vessel has at least one flat external surface, and the ignition electrode covers a portion of the flat external surface.

15. The apparatus of claim 14, wherein the flat external surface has an annular shape.

16. The apparatus of claim 1, wherein a cross section of the vessel has a curved portion.

17. The apparatus of claim 16, wherein a cross section of the vessel has an elliptical shape.

18. The apparatus of claim 1, further comprising at least one magnetic core that at least partially surrounds a portion of the vessel to support formation of an oscillatory electric field within the channel.

19. The apparatus of claim 1, wherein the vessel defines a linear shape, and has a proximate end and a distal end.

20. The apparatus of claim 1, wherein the at least one ignition electrode comprises a ceramic substrate and a conductive film formed on the ceramic substrate.

21. The apparatus of claim 1, comprising a control circuit that removes power from the at least one capacitively coupled ignition electrode after formation of an inductive plasma.

22. The apparatus of claim 1, wherein the at least one capacitively coupled ignition electrode is a heat sink segment in thermal communication with the vessel.

23. The apparatus of claim 1, comprising multiple capacitively coupled ignition electrodes one or more of which are in thermal communication with the vessel.

24. The apparatus of claim 6, wherein the ignition electrodes are in thermal communication with the vessel.

25. The apparatus of claim 1, comprising a light-blocking layer coating the vessel to block ultraviolet radiation generated by the plasma.

26. The apparatus of claim 25, wherein the light-blocking layer is a heat spreading layer and assists cooling of the vessel.

27. The apparatus of claim 1, comprising multiple capacitively coupled ignition electrodes distributed around the vessel to provide a distributed capacitive discharge that fills a substantial portion of the volume of the vessel.

28. The apparatus of claim 1, wherein the ignition electrode is formed from a metal film on a surface of the vessel that is made of a material that minimizes metal diffusion or electromigration.

29. The apparatus of claim 1, wherein the ignition electrode is made from a refractory materials.

30. The apparatus of claim 1, wherein the ignition electrode is made from titanium, tantalum, tungsten, an alloy thereof, compound conductive material or TiN.

31. An inductively coupled plasma processing apparatus, comprising:
a dielectric toroidal vessel defining an enclosed channel;
at least one capacitively coupled ignition electrode adjacent to the vessel and having a dimension aligned with an adjacent portion of the channel, wherein a total length of the dimension of the at least one ignition electrode is greater than 10% of a length of the channel, whereby the at least one ignition electrode can apply an electric field to a gas in the channel to initiate a plasma discharge in the gas;
a transformer comprising a primary winding and a magnetic core that surrounds a portion of the vessel;
an AC power supply that supplies power to the primary winding to maintain a plasma in the toroidal vessel; and
a process vessel defining a process chamber that receives activated gas species from the vessel.

32. A method for plasma processing in a toroidal, inductively coupled plasma processing system, the method comprising:
providing a toroidal vessel defining an enclosed channel;
providing at least one capacitively coupled ignition electrode adjacent to the vessel and having a dimension aligned with an adjacent portion of the channel, wherein a total length of the dimension of the at least one ignition electrode is greater than 10% of a length of the channel;
initiating a plasma discharge in a gas in the channel by applying a voltage to the at least one ignition electrode;
providing a transformer comprising a primary winding and a magnetic core that surrounds a portion of the vessel;
supplying power to the primary winding from an AC power supply to maintain the plasma in the toroidal vessel; and
directing activated gas species from the toroidal vessel to a process chamber defined by a process vessel.

33. The method of claim 32, wherein igniting comprises igniting the plasma when the gas is essentially free of argon.

34. The method of claim 32, wherein igniting comprises igniting the plasma when the gas essentially has a process pressure and flow rate.

* * * * *